United States Patent
Moriya

(10) Patent No.: US 8,497,156 B2
(45) Date of Patent: Jul. 30, 2013

(54) SEMICONDUCTOR DEVICE AND MANUFACTURING METHOD OF THE SAME

(75) Inventor: Susumu Moriya, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/198,986

(22) Filed: Aug. 5, 2011

(65) Prior Publication Data

US 2011/0294261 A1 Dec. 1, 2011

Related U.S. Application Data

(60) Division of application No. 12/479,915, filed on Jun. 8, 2009, now Pat. No. 8,018,033, which is a continuation of application No. PCT/JP2007/051601, filed on Jan. 31, 2007.

(51) Int. Cl.
*H01L 21/00* (2006.01)
*H01L 23/552* (2006.01)

(52) U.S. Cl.
USPC ........... 438/106; 438/109; 438/121; 257/659; 257/660; 257/704; 257/E21.499; 257/E21.519

(58) Field of Classification Search
USPC .............. 438/106, 109, 121; 257/659, 660, 257/704, E21.499, E21.519, E23.104
See application file for complete search history.

(56) References Cited

U.S. PATENT DOCUMENTS

| 6,369,454 | B1 | 4/2002 | Chung |
| 6,770,164 | B1* | 8/2004 | Schrock et al. ............ 156/306.9 |
| 7,030,469 | B2 | 4/2006 | Mahadevan et al. |
| 7,667,312 | B2 | 2/2010 | Kawakami et al. |
| 2004/0012099 | A1 | 1/2004 | Nakayama |
| 2004/0178500 | A1 | 9/2004 | Usui |
| 2005/0067676 | A1 | 3/2005 | Mahadevan et al. |
| 2006/0065965 | A1* | 3/2006 | Ohsaka ......................... 257/690 |
| 2007/0075323 | A1* | 4/2007 | Kanazawa et al. ............. 257/98 |
| 2008/0185692 | A1 | 8/2008 | Salzman |

FOREIGN PATENT DOCUMENTS

| CN | 1441489 A | 9/2003 |
| JP | 3-120740 A | 5/1991 |
| JP | 2000-200859 A | 7/2000 |
| JP | 2001-007252 A | 1/2001 |
| JP | 2001-244688 A | 9/2001 |
| JP | 2003-174122 A | 6/2003 |
| JP | 2003-249607 A | 9/2003 |
| JP | 2006-173493 A | 6/2006 |
| KR | 10-2004-0025631 A | 3/2004 |

OTHER PUBLICATIONS

Chinese First Office Action, Partial English-language, issued Jan. 12, 2011 for corresponding Chinese Application No. 200780049019.3.

(Continued)

*Primary Examiner* — Long K Tran
(74) *Attorney, Agent, or Firm* — Fujitsu Patent Center

(57) ABSTRACT

A semiconductor device includes a wiring board, a semiconductor element mounted on the wiring board, a sealing resin configured to cover the semiconductor element, a ground electrode having an end connected to a wiring layer of the wiring board and an exposing part exposed at a surface of the sealing resin, and a shielding member configured to cover the sealing resin and be connected to the ground electrode.

5 Claims, 32 Drawing Sheets

OTHER PUBLICATIONS

Korean Notice of Preliminary Rejection, English-language Translation, mailed Jan. 20, 2011 for corresponding Korean Application No. 10-2009-7012746.
International Search Report of PCT/JP2007/051601, Mailing Date of Apr. 17, 2007.
USPTO, [TRAN] "U.S. Appl. No. 12/479,915 (parent)," [CTNF] Non-Final Office Action issued on Jan. 26, 2011.
USPTO, [TRAN] "U.S. Appl. No. 12/479,915 (parent)," [CTRS] Requirement for Restriction/Election issued on Dec. 17, 2010.
USPTO, [TRAN] "U.S. Appl. No. 12/479,915 (parent)," [NOA] Notice of Allowance and Fees Due issued on Jul. 5, 2011.
Japanese Office Action mailed Apr. 24, 2012 for corresponding Japanese Application No. 2008-555983, with Partial English-language Translation.
Japanese Office Action mailed Jul. 10, 2012 for corresponding Japanese Application No. 2008-555983, with English-language Translation.

* cited by examiner

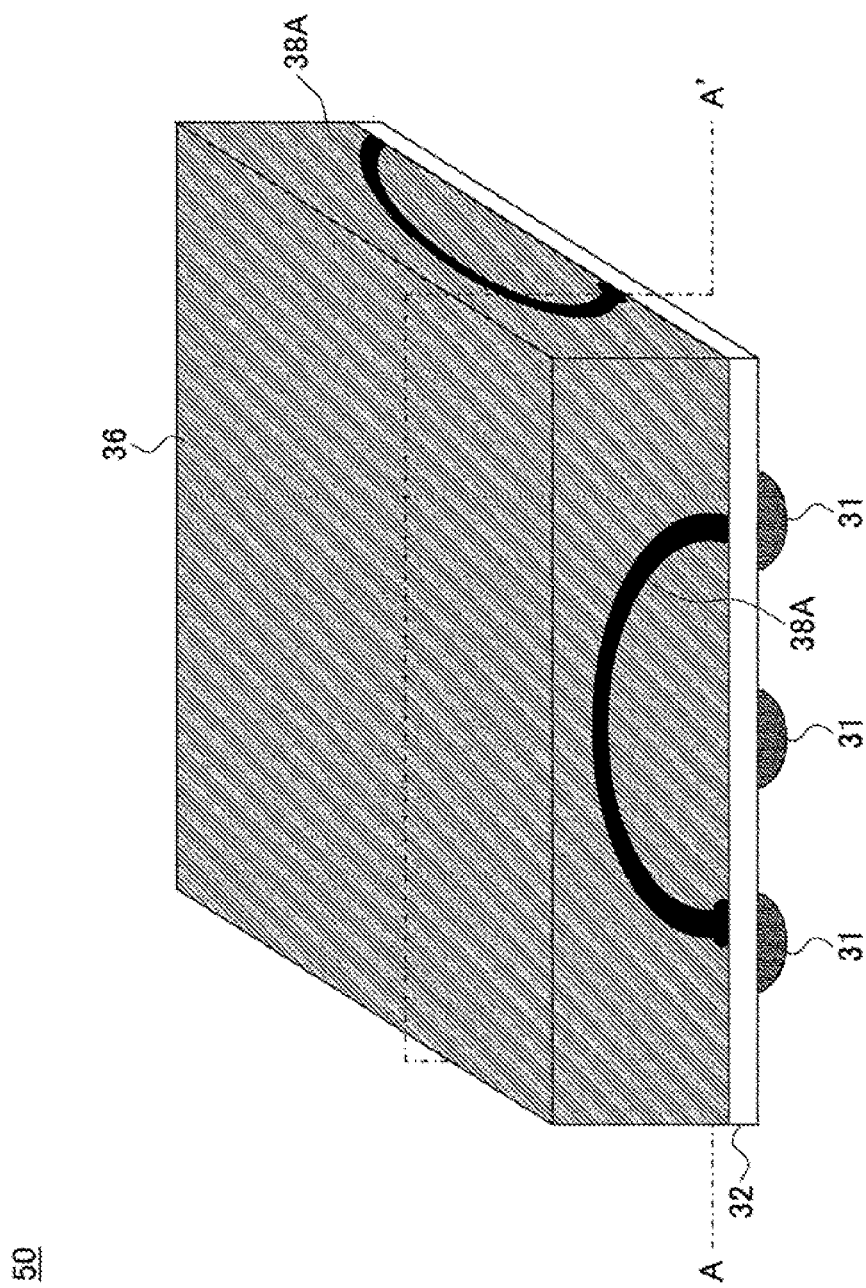

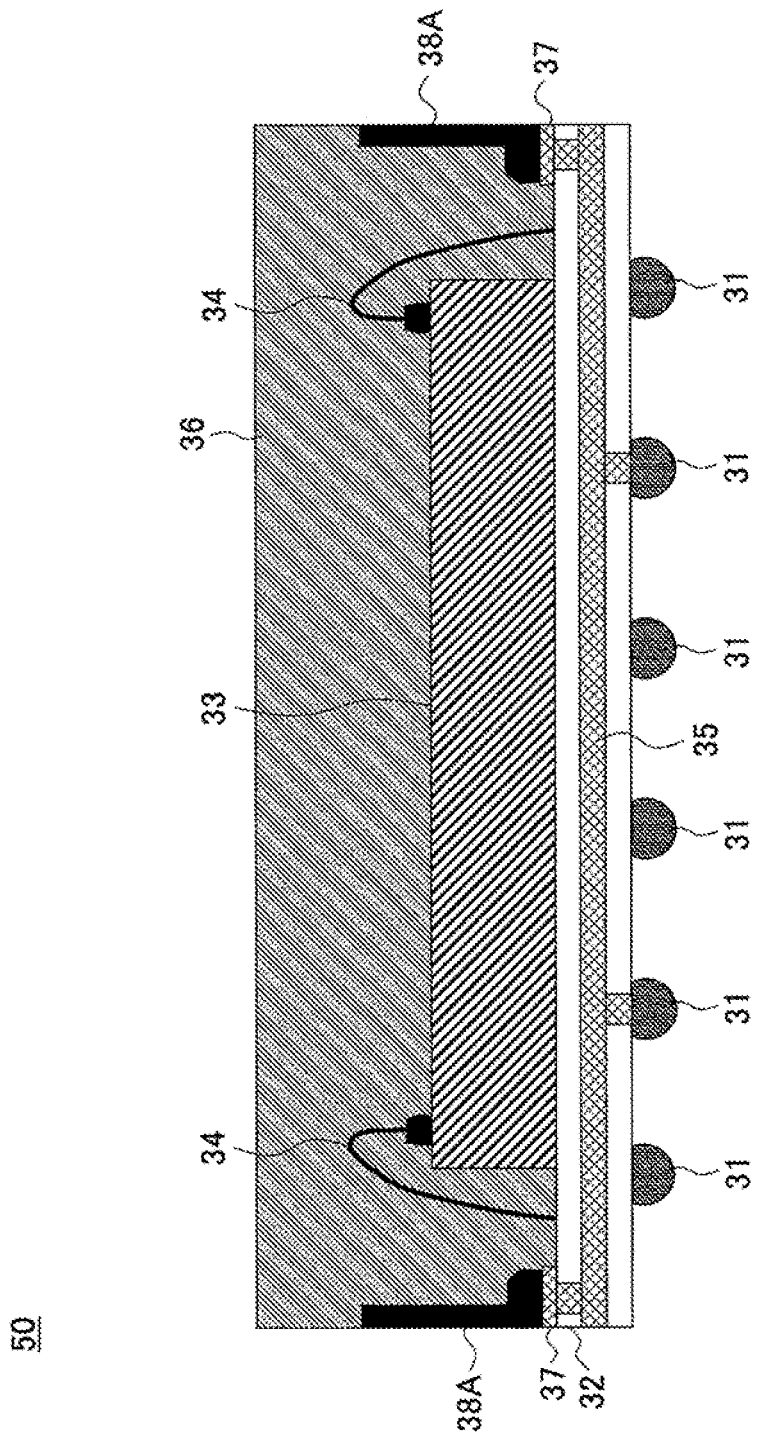

$L \leq P$

SEMICONDUCTOR DEVICE AND MANUFACTURING METHOD OF THE SAME

CROSS-REFERENCE TO RELATED APPLICATIONS

This patent application is based upon and claims the benefit of priority under 35 USC 120 and 365(c) of PCT application JP2007/051601 filed in Japan on Jan. 31, 2007, the entire contents of which are incorporated herein by reference.

FIELD

The embodiments discussed herein are related to semiconductor devices and manufacturing methods of the same.

BACKGROUND

When a semiconductor device where a semiconductor element is mounted on a wiring board is installed and used in an electronic device, due to electromagnetic waves radiated from the semiconductor element, an error in operation of an electric circuit or an electronic component situated in the vicinity of the semiconductor element may be caused or bad influence on a human body may happen. In particular, digitization has progressed in recent electronic devices so that signal sources handle pulse signals. Therefore, a high frequency element of the pulse signal may easily become a noise source. In addition, as high frequency or high speed of signals progresses, influence thereof also progresses.

On the other hand, the semiconductor element may be influenced by electromagnetic waves generated in neighboring electronic components and/or electric circuits or an external atmosphere.

Because of this, it is required to electromagnetically shield the semiconductor element from the surrounding atmosphere. For example, a structure illustrated in FIG. 1 has been suggested.

Referring to FIG. 1, a semiconductor device 10 is a so-called BGA (Ball Grid Array) type semiconductor device. A semiconductor element 3 is mounted and fixed on a wiring board 2 via a die bonding material not illustrated in FIG. 1 such as a die bonding film. Plural spherical-shaped bumps 1 for outside connection are provided on a lower surface of the wiring board 2. An electrode (not illustrated in FIG. 1) of the semiconductor element 3 is connected to an electrode (not illustrated in FIG. 1) of the wiring board 2 via a bonding wire 4. In addition, the semiconductor element 3, the bonding wire 4, and others are sealed by sealing resin 5.

The semiconductor device 10 is mounted on a wiring circuit board (mother board) 11 via solder or the like so as to be connected to a wiring part of the wiring circuit board 11. For example, the spherical-shaped bumps 1 (two spherical-shaped bumps 1 in the example illustrated in FIG. 1) provided on the lower surface of the wiring board 2 and connected to a ground conductive layer 12 in the wiring board 2 are connected to a ground wiring pattern 13 of the wiring circuit board 11.

Under this structure, it is necessary to block the electromagnetic waves emitted from the semiconductor element 1 from going outside and prevent influence of the electromagnetic waves from the outside atmosphere. However, the structure of the semiconductor device 10 does not have a shielding effect against the electromagnetic waves.

Because of this, a large size metal shielding member 14 is provided on the wiring circuit board 11 so as to cover a surface of the wiring circuit board including a portion where the semiconductor device 10 is provided. A cross section of the shielding member 14 has a configuration of a rectangle lacking one side. The shielding member 14 is connected to electrodes 15 provided on the upper surface of the wiring circuit board 11 via solder. The electrodes 15 are connected to the ground wiring pattern 13 of the wiring circuit board 11.

A process of attaching the shielding member 14 on the wiring circuit board 11 is performed after the semiconductor device 10 is mounted on the wiring circuit board 11.

In addition, in order to improve the efficiency of operations and reduce the number of the shielding members 14, the following example is applied. That is, after plural semiconductor devices 10 are mounted on the wiring circuit board 11, a shielding member is provided on the wiring circuit board 11 so as to shield plural semiconductor devices 10 in a lump.

A high-frequency module component including a resin coating member which has a conduction hole reaching a terminal electrode having ground potential of an electronic component, and a shield metal film which covers the resin coating material has been suggested in Japanese Laid-Open Patent Application Publication No. 2001-244688. In addition, a semiconductor device where a plate is connected to a rear face of a semiconductor substrate having an element electrode on a main face has been suggested in Japanese Laid-Open Patent Application Publication No. 2001-7252. A semiconductor element package where a shield metal layer for electromagnetic shielding is provided on a surface opposite to a lead pattern forming surface of a substrate has been suggested in Japanese Laid-Open Patent Application Publication No. 3-120746.

However, in the structure illustrated in FIG. 1, it is necessary to secure a connecting and fixing area of the shielding member 14 on the wiring circuit board 11. Here, the connecting and fixing area of the shielding member 14 is where the electrodes 15 connected to end parts of the shielding member 14 via the solder are provided. Accordingly, it is difficult to make the size of the wiring circuit board 11 small and to make the size of the electronic device 10 having the wiring circuit board 11 small.

In addition, a process of covering the semiconductor device 10 mounted on the wiring circuit board 11 with the shielding member 14 is performed after the semiconductor device 10 is mounted on the wiring circuit board 11. Therefore, the assembling process is complex.

Furthermore, in a structure where plural semiconductor devices 10 are mounted on the wiring circuit board 11 and the semiconductor devices 10 are shielded in a lump by the shielding member, mutual influence of the electromagnetic waves may occur among the semiconductor devices 10 covered by the shielding member 14 so that errors in operations may happen.

SUMMARY

According to an aspect of the invention, it is possible to provide a semiconductor device, including a wiring board; a semiconductor element mounted on the wiring board; a sealing resin configured to cover the semiconductor element; a ground electrode having an end connected to a wiring layer of the wiring board and an exposing part exposed at a surface of the sealing resin; and a shielding member configured to cover the sealing resin and be connected to the ground electrode.

According to other aspect of the invention, it is possible to provide a semiconductor device, including a wiring board; a semiconductor element mounted on the wiring board; a sealing resin configured to cover the semiconductor element; and a ground electrode having an end connected to a wiring layer of the wiring board and an exposing part exposed at a surface of the sealing resin.

According to other aspect of the invention, it is possible to provide a manufacturing method of a semiconductor device including mounting plural semiconductor elements on a wiring board; providing a ground electrode member so that the ground electrode member strikes an area of the wiring board where neighboring of the semiconductor elements are provided; covering the semiconductor elements and the ground electrode member with sealing resin; cutting the wiring board, the sealing resin and the ground electrode member so that a piece of the semiconductor device is formed; and providing a shielding member to cover the sealing resin of the piece of the semiconductor device.

According to other aspect of the invention, it is possible to provide a manufacturing method of a semiconductor device including providing a ground electrode member on a separation line of a board where plural semiconductor elements are provided, the separation line separating neighboring semiconductor elements; sealing the ground electrode member and the semiconductor elements by resin; cutting the ground electrode member along the separation line when the board where the plural semiconductor elements are provided is cut, so that a part of the ground electrode member is exposed at a side surface of the resin; and providing a metal member configured to cover the resin so as to make the metal member come in contact with the part of the ground electrode member exposed at the side surface of the resin.

According to other aspect of the invention, it is possible to provide a manufacturing method of a semiconductor device including mounting plural semiconductor elements on a wiring board; providing a ground electrode member so that the ground electrode member strikes an area of the wiring board where neighboring of the semiconductor elements are provided; covering the semiconductor elements and the ground electrode member with sealing resin; and cutting the wiring board, the sealing resin and the ground electrode member so that a piece of the semiconductor device is formed.

The object and advantages of the invention may be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 6 is a perspective view of a semiconductor device of a second embodiment;

FIG. 7 is a cross-sectional view illustrating a structure of the semiconductor device of the second embodiment;

DETAILED DESCRIPTION OF THE PREFERRED EMBODIMENTS

Preferred embodiments will be explained with reference to accompanying drawings. For the convenience of explanations, semiconductor devices of embodiments are discussed and then manufacturing methods of the semiconductor devices are discussed.

The embodiments provide a semiconductor device and a manufacturing method of the same, whereby an electromagnetic wave can be shielded securely with a simple structure and without requiring a large size wiring circuit board (mother board).

<Semiconductor Device>

1. First embodiment of the semiconductor device

Figure 1:
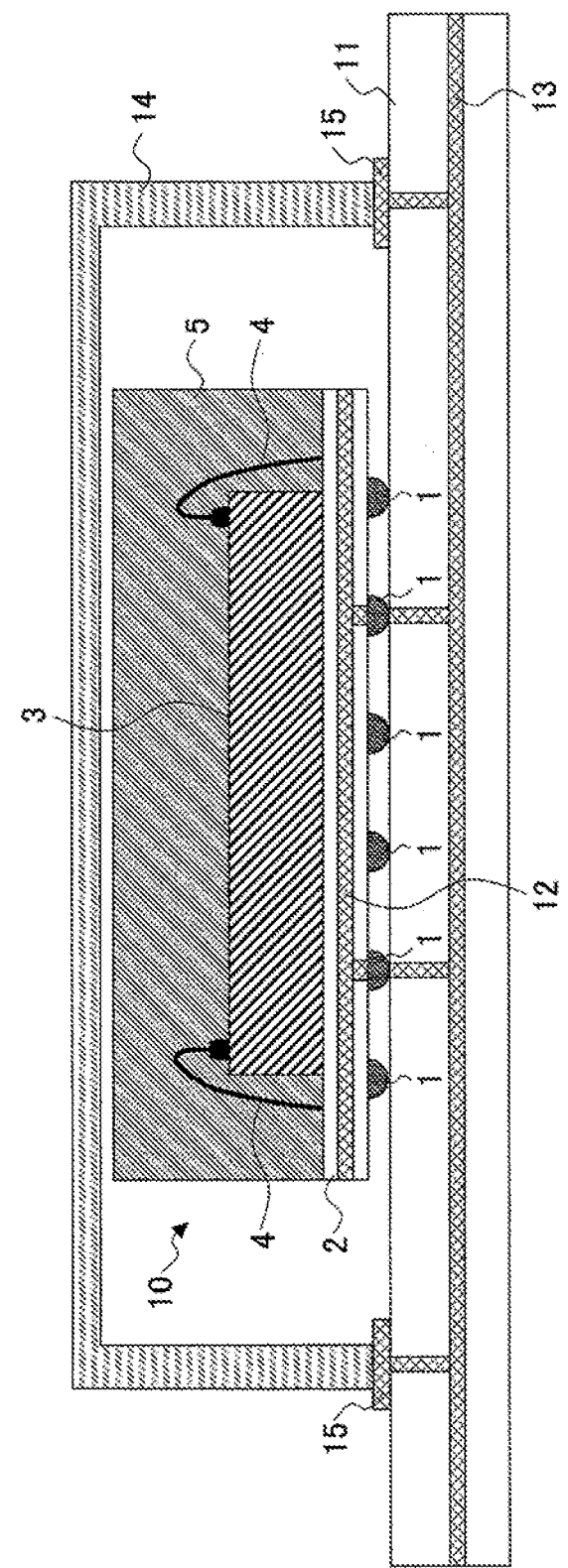
FIG. 1 is a cross-sectional view illustrating a related art structure where a semiconductor device mounted on a wiring circuit board is shielded.
Figure 2:
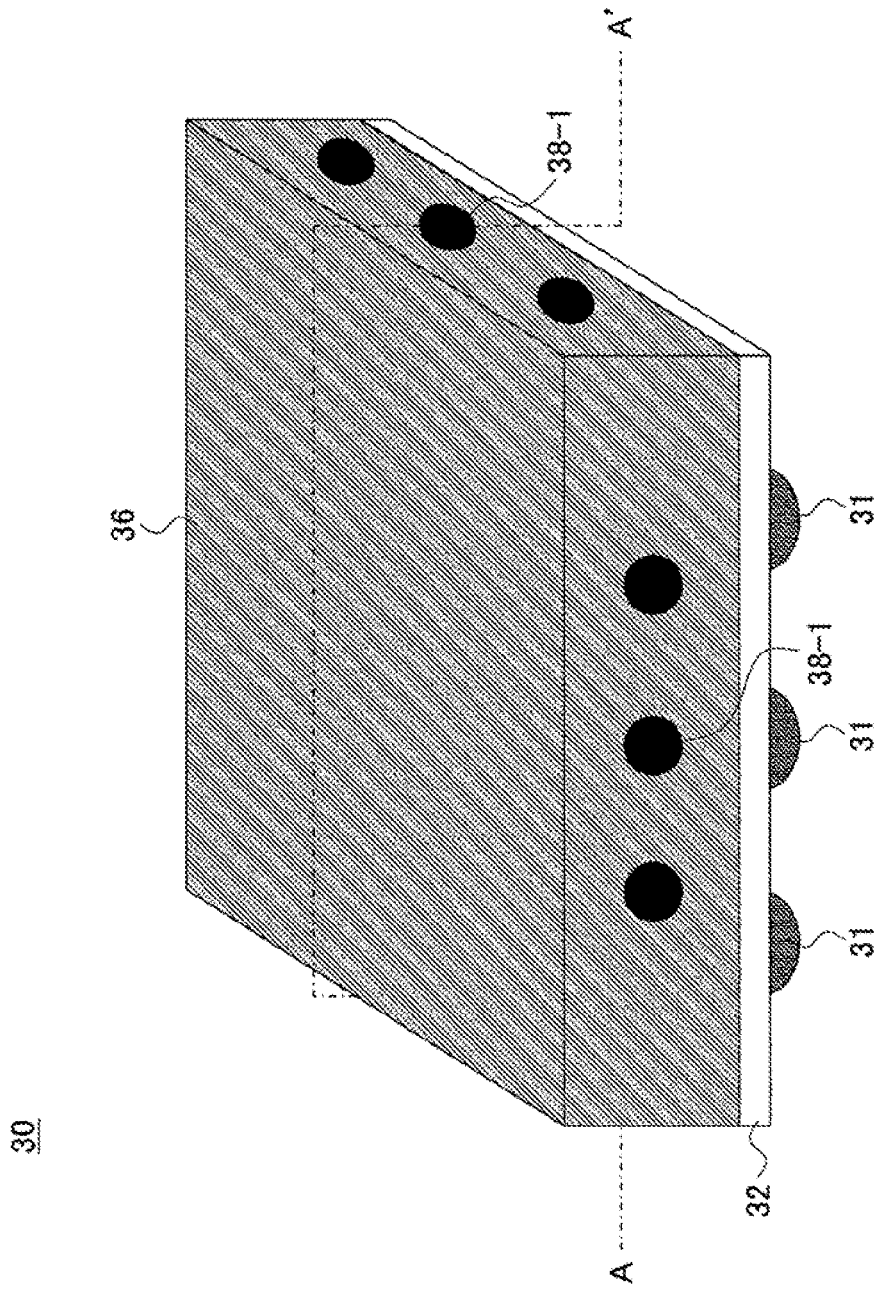
FIG. 2 is a perspective view of a semiconductor device of a first embodiment.
Figure 3:
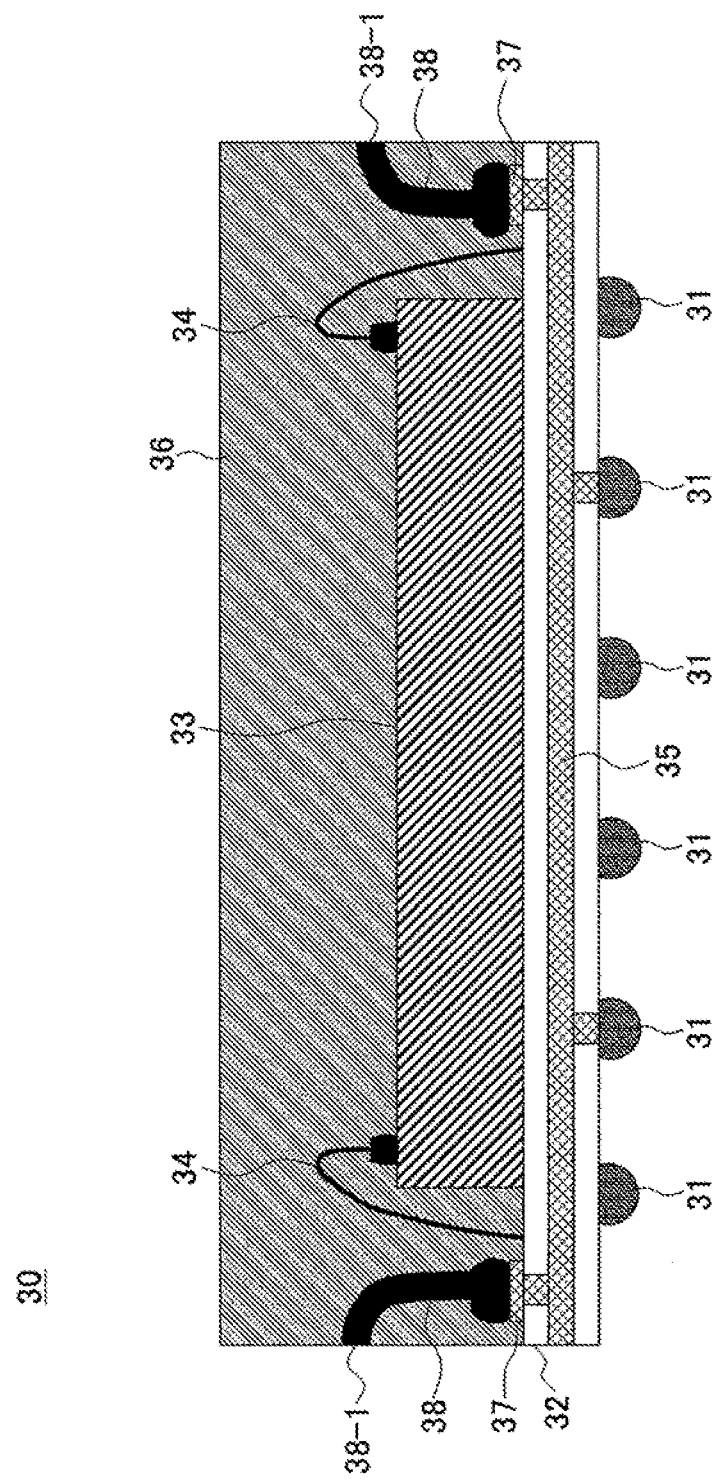
FIG. 3 is a cross-sectional view illustrating a structure of a semiconductor device of the first embodiment.

A semiconductor device of a first embodiment is illustrated in FIG. 2. A cross section of the semiconductor device is illustrated in FIG. 3. FIG. 3 is a cross section taken along a line A-A' of FIG. 2.

A semiconductor device 30 of the first embodiment is a so-called BGA (Ball Grid Array) type semiconductor device.

As illustrated in FIG. 3, a semiconductor element 33 is mounted on a wiring board 32 via a die bonding material (not illustrated in FIG. 3) such as a die bonding film. Plural spherical-shaped bumps 31 as outside connection terminals are provided on a lower surface of the wiring board 32.

Electrode pads (not illustrated in FIG. 3) of the semiconductor element 33 are connected to electrodes (not illustrated in FIG. 3) on the wiring board 32 via bonding wires 34. The bonding wire 34 is made of a gold (Au) wire, a copper (Cu) wire, or the like. The bonding wire 34 has a diameter of approximately 18 μm through approximately 30 μm.

Under this structure, a ground wiring pattern 35 is provided on a surface of or inside the wiring board 32. Parts of the spherical-shaped bumps 31 (two spherical-shaped bumps 31 in the example illustrated in FIG. 3) provided on the lower surface of the wiring board 32 are connected to the ground wiring pattern 35.

In addition, the semiconductor element 33, the bonding wires 34, and others are sealed on one of main surfaces (an upper surface) of the wiring board 32 by sealing resin 36 made of silicon group resin, acrylic resin, epoxy resin, or the like.

In the semiconductor device 30, electrode pads 37 connected to the ground wiring pattern 35 are provided at four sides on an upper surface of the wiring board 32. The electrode pads 37 are provided in an area of the wiring board 32 where the semiconductor element 33 and the bonding wires 34 are not provided, namely, in the vicinity of a circumferential edge part of the wiring board 32.

In addition, an end of a wire ground electrode 38 is connected to the electrode pad 37 by a wire bonding method. Another end of the ground electrode 38 is exposed at an external side surface of the sealing resin 36. The ground electrode 38, as well as the bonding wire 34, is made of a gold (Au) wire, a copper (Cu) wire, or the like.

In the first embodiment, three ground electrodes 38 are provided at each of four sides of the wiring board 32. The ground electrode 38 extends from the electrode pad 37 upward, is gently bent in a direction separating from the semiconductor element 33, and reaches the external side surface of the sealing resin 36.

The diameter of the ground electrode 38 is substantially equal to or greater than the diameter of the bonding wire 34. For example, the diameter of the ground electrode 38 is approximately 100 μm through approximately 500 μm.

Thus, in the semiconductor device 30 of the first embodiment, one end of the ground electrode 38 is connected to ground potential and another end of the ground electrode 38 is exposed at a side surface of the sealing resin 36.

Accordingly, by providing an electromagnetic shielding member (an electric conductor: hereinafter "shielding member") so as to cover the external side surface of the sealing resin 36 and connecting the shielding member to an end part of the ground electrode 38, the semiconductor device 30 is effectively and electromagnetically shielded by the shielding member at the time of the operation of the semiconductor device 30.

Thus, by providing the electromagnetic shielding member so as to cover the external side surface of the sealing resin 36, the semiconductor device 30 is effectively and electromagnetically shielded without causing an unnecessary increase of external dimensions of the semiconductor device 30.

As the shielding member configured to cover the external surface of the sealing resin 36, a box-shaped metal body (having a cross section of a rectangle without one side) or a resin body having a surface with a covering conductive layer is prepared. This metal body or the resin body is provided so as to cover and be engaged with the sealing resin 36 so that the metal body or the resin body can be applied to the semiconductor device 30.

In addition, as the shielding member and a method of providing the shielding member, a method for adhering metal foil or a method for selectively applying conductive resin can be used.

Accordingly, such a shielding member can be provided, as necessary, before or after the semiconductor device is mounted on a wiring board (mother board) of an electronic device.

On the other hand, the shielding member may be thermally connected to a heat radiator (heat sink) applied for heat radiation of the semiconductor device. In addition, when the shielding member itself is used as the heat radiator, an area of an external surface of the shielding member may be expanded.

Figure 4:
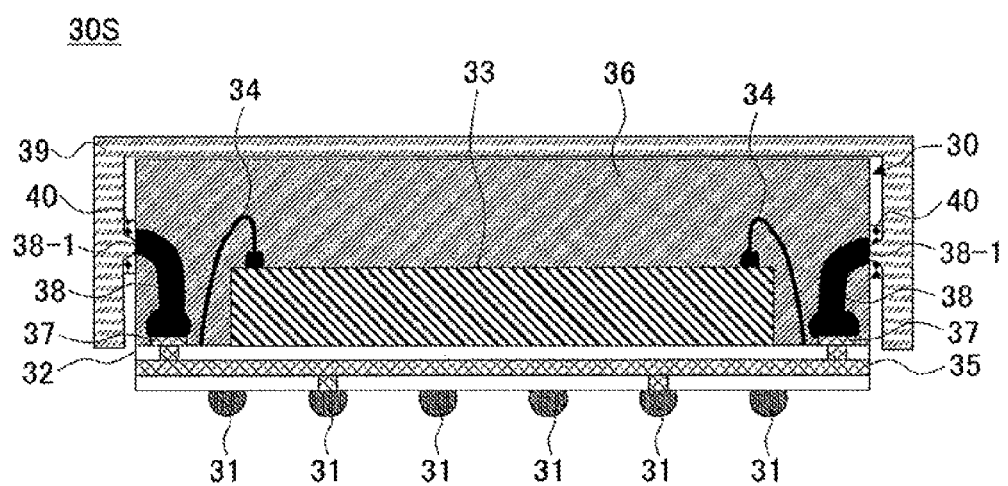
FIG. 4 is a cross-sectional view illustrating a shielding member provided to the semiconductor device of the first embodiment.

A state where the shielding member is provided to the semiconductor device 30 having the above-discussed structure is illustrated in FIG. 4. The semiconductor device having the shielding member is illustrated as a semiconductor device 30S in FIG. 4.

In other words, a box-shaped electromagnetic shielding member 39 (having a cross section of a rectangle without one side) is provided so as to cover the sealing resin 36 of the semiconductor device 30. The electromagnetic member 39 is made of a metal plate such as copper (Cu), aluminum (Al) or the like. The electromagnetic shielding member 39 may be made of another material such as resin and a metal covering may be formed on the surface of the electromagnetic shielding member 39.

An internal side surface and/or an internal bottom surface of the shielding member 39 and the surface of the sealing resin 36 are fixed to each other by an adhesive (not illustrated in FIG. 4).

In addition, the internal side surface of the shielding member 39 and an end part 38-1 of the ground electrode 38 led to the side surface of the sealing resin 36 of the semiconductor device 30 are connected to each other via an adhesive member 40 made of a conductive adhesive such as solder or silver (Ag) paste so that electric conductance is made. Furthermore, a convex part, corresponding to the end part 38-1 of the ground electrode 38, is provided on the internal side surface of the shielding member 39.

Under this structure, ground potential is applied to the shielding member 30 at least at the time of operations of the semiconductor device 30.

Figure 9:
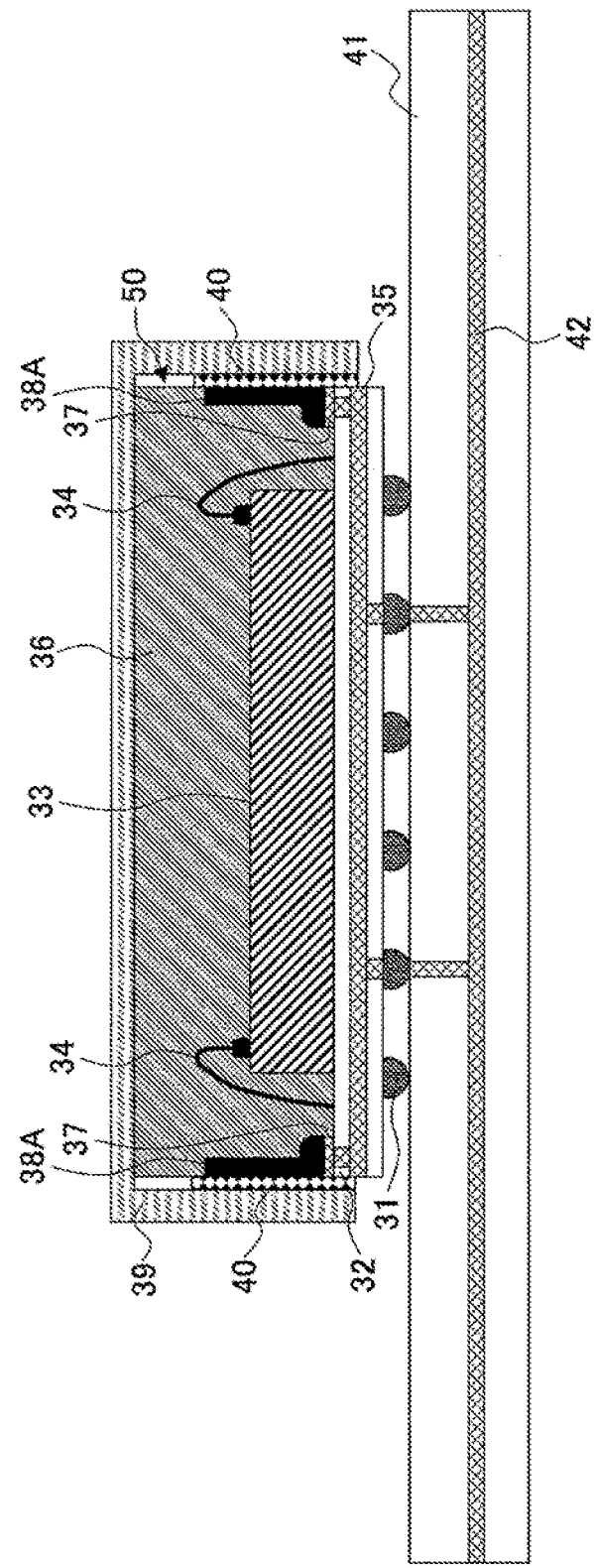
FIG. 9 is a cross-sectional view illustrating the semiconductor device of the second embodiment having the shielding member mounted on a wiring circuit board.

A state where a semiconductor device 50 covered by the shielding member 39 is mounted on the wiring board (mother board) 41 is illustrated in FIG. 9.

Figure 5A:
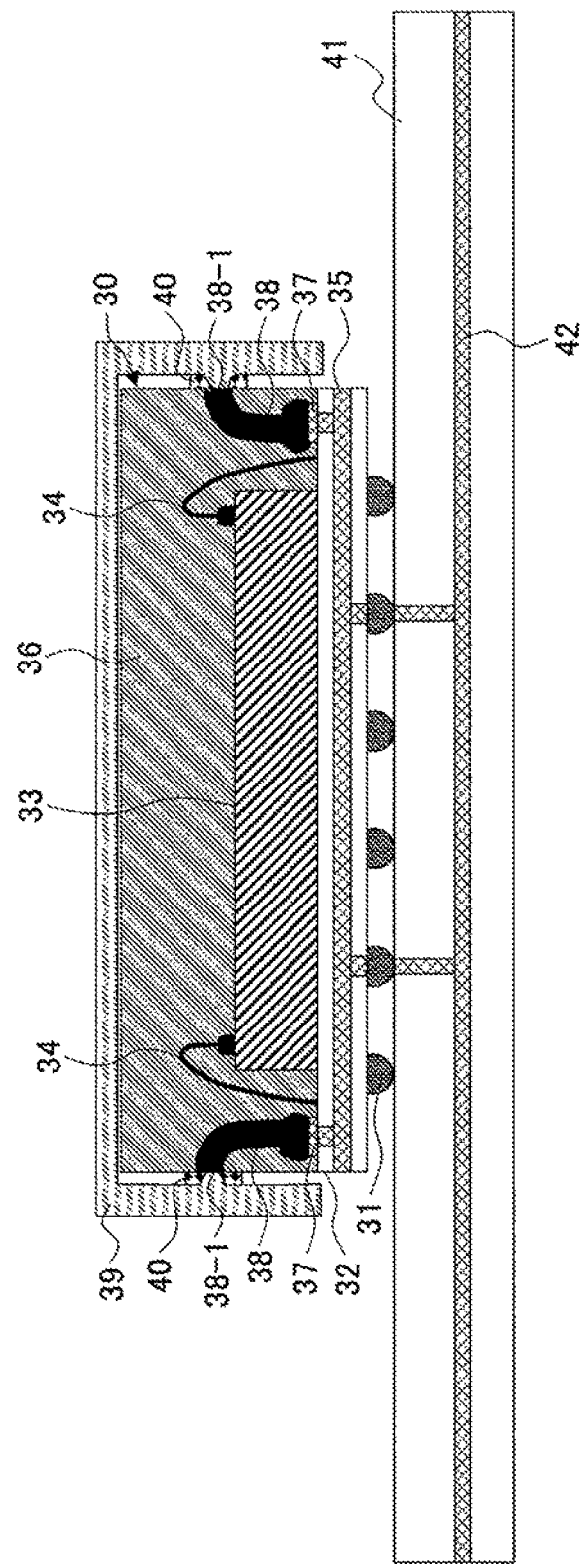
FIG. 5A is a cross-sectional view illustrating the semiconductor device of the first embodiment having the shielding member mounted on a wiring circuit board.

Referring to FIG. 5A, in the semiconductor device 30S mounted on the wiring circuit board (mother board) 41 via the spherical-shaped bumps 31, the shielding member 39 covering the semiconductor device 30S is electrically connected to a ground wiring pattern 42 of the wiring circuit board 41.

In other words, under this structure, some spherical-shaped bumps 31 connected to the ground wiring pattern 35 of the wiring board 32 among plural spherical-shaped bumps 31 provided on the lower surface of the wiring board 32 of the semiconductor device 30 are connected to the ground wiring pattern 42 provided in the wiring circuit board 41.

As a result of this, the shielding member 39 covering the semiconductor device 32 is connected to the ground wiring pattern 42 of the wiring circuit board 41 via the adhesive members 40, the ground electrodes 38, the electrode pads 37, the ground wiring pattern 35 of the wiring board 32, and the spherical shaped bumps 31 so that ground potential is applied. Accordingly, radiation of the electromagnetic waves generated from the semiconductor element 33 to the outside is blocked. Furthermore, the semiconductor device 30 is also shielded from the influence of the electromagnetic waves from the outside atmosphere.

In the semiconductor device 30 of the first embodiment, the box-shaped electromagnetic shielding member 39 (having a cross section of a rectangle without one side) is provided so as to cover the surface of the sealing resin 36 of the semiconductor device 30. Accordingly, increase of an area which the shielding member 39 occupies is not caused so that it is possible to miniaturize the wiring circuit board (mother board) 41.

The shielding member 39 is provided to each of the semiconductor devices 30. Since it is possible to provide a semiconductor device 30 which is shielded individually, there is no need to shield plural semiconductor devices, in a lump, mounted on the wiring circuit board 41. Accordingly, the freedom degree of design of the wiring circuit board 41 is increased so that miniaturization of the electronic devices 30 can be achieved.

In addition, it is possible to radiate heat generated based on the operation of the semiconductor device 30 to the outside via the ground electrodes 38 and the metal shielding member 39. Therefore, it is possible to stably operate the semiconductor device 30.

Of course, it is possible to shield plural semiconductor devices 30, in a lump, mounted on the wiring circuit board 41. In other words, a common shielding structure can be provided.

Such a structure is selected depending on the structure of the electronic device or an electronic circuit.

Figure 5B:
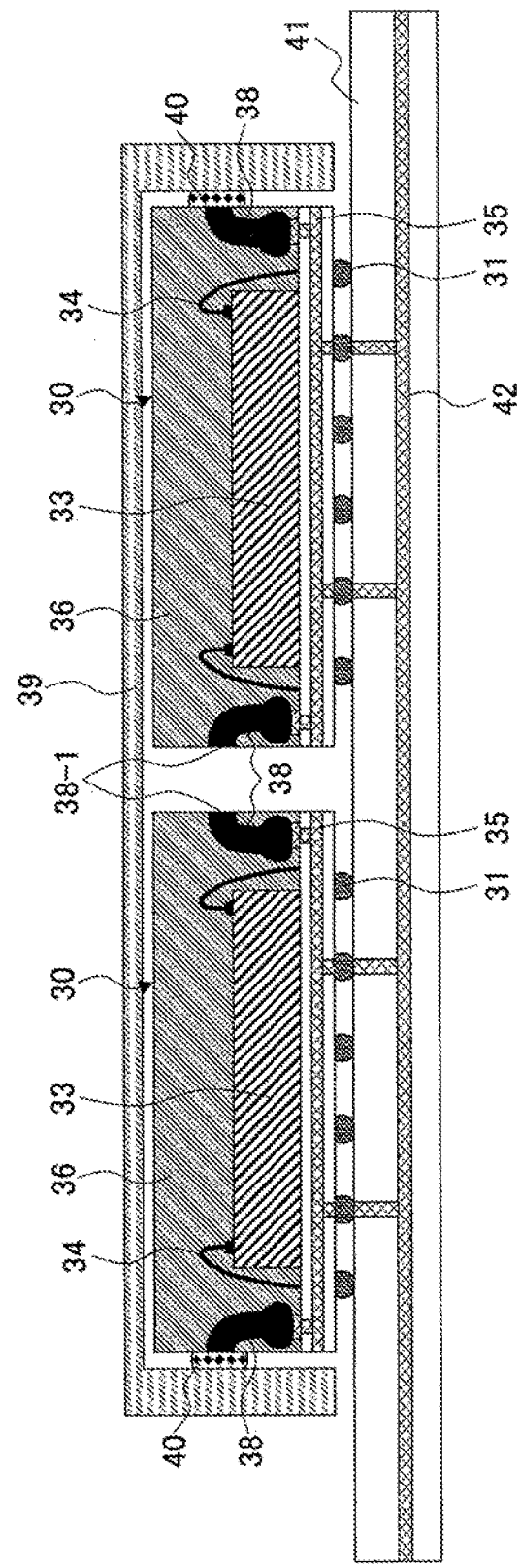
FIG. 5B is a cross-sectional view illustrating a state where a shielding member is provided so as to commonly cover plural semiconductor devices of the first embodiment mounted on the wiring circuit board.

In other words, as illustrated in FIG. 5B, it is possible to commonly cover plural (for example, two) semiconductor devices 30 mounted on the wiring circuit board 41 with a single box-shaped electromagnetic shielding member 39 (having a cross section of a rectangle without one side). A semiconductor device having such a structure is illustrated in FIG. 5B as a semiconductor device 30SS.

Under this structure, the shielding member 39 is connected to the end part 38-1 of the ground electrode 38 lead to an external side surface of the sealing resin 38 of at least one of the semiconductor devices 30 via the adhesive member 40, and thereby ground potential is applied. Here, a convex part corresponding to the end part 38-1 of the ground electrode 38 is not provided at an internal side surface of the shielding member 39. However, the convex part may be provided if necessary as in the structure illustrated in FIG. 4.

Under this structure, the shielding member 39 (commonly) covers plural semiconductor devices 30 in a lump and has external dimensions substantially same as the external dimensions of the plural semiconductor devices 30. Accordingly, it may not require a big size of the wiring circuit board 41 due to the arrangement of the shielding member 39.

Furthermore, under this structure, gaps among plural semiconductor devices 30 covered with the shielding member 39 are selected if necessary. Because of this, the gaps among plural semiconductor devices 30 can be provided and a part of the shielding member 39 can be extended in a horizontal or vertical direction in the gap. As a result of this, gaps among plural semiconductor devices 30 covered with the shielding member 39 can be electromagnetically shielded.

Although the ground electrode 38 extends from the electrode pad 37 upward (in the vertical direction) and is gently bent in a direction separated from the semiconductor element 33 in the first embodiment, another structure can be applied.

The ground electrode 38 may be a metal wire or a metal plate which extends from the electrode pad 37 in a substantially vertical direction and is bent at a substantially right angle in a direction separating from the semiconductor element 33. In this case, the end part 38-1 may be led to and exposed at the side surface of the sealing resin 36.

In the above-discussed embodiment, three ground electrodes 38 are provided at each of four sides of the wiring board 32 on the upper surface of the wiring board 32. However, there is no limitation of the number of the ground electrodes 38 to be provided. At least one ground electrode 38 may be exposed at the side surface of the sealing resin 36 and may be connected to the shield member 39. If connections between the ground electrodes 38 and the shielding member 39 are made at plural portions, it is possible to decrease electrical resistance so that stable electrical connection can be made and it is possible to achieve a further heat radiation effect.

2. Second Embodiment of the Semiconductor Device

A semiconductor device of a second embodiment is illustrated in FIG. 6. A cross section of the semiconductor device is illustrated in FIG. 7. FIG. 7 is a cross section taken along a line A-A' of FIG. 6.

A semiconductor device 50 of the second embodiment is a so-called BGA (Ball Grid Array) type semiconductor device.

In the following explanation, parts that are the same as the parts already explained are given the same reference numerals, and detailed explanation thereof is omitted.

In the second embodiment, as illustrated in FIG. 6 and FIG. 7, ground electrodes 38A made of a gold (Au) line, a copper (Cu) line, or the like are connected to two electrode pads 37 connected to the ground wiring pattern 35 of a single wiring board 32. Two electrode pads 37 are connected to each other by the ground electrode 38A having a substantially circular arc-shaped wire loop configuration. The ground electrode 38A is formed by a wire having a diameter of, for example, approximately 300 μm through approximately 400 μm or a belt-shaped body having the substantially equal width.

In the second embodiment, as illustrated in FIG. 6 and FIG. 7, ground electrodes 38A are made of a gold (Au) line, and a single loop-shaped ground electrode 38A is provided along each of four sides of the wiring board 32. The side surface part of the circular arc-shaped part of the ground electrode 38A is exposed at the side surface of the sealing resin 36 to the outside. The ground electrode 38A extends in a circular arc-shaped form along the side of the wiring board 32. Accordingly, a part of the ground electrode 38A extending in the height direction is illustrated in FIG. 7. In addition, a method of exposing the circular arc-shaped part of the ground electrode 38A to the outside at the side surface of the sealing resin 36 is discussed below.

In the second embodiment, a conductor having an end part connected to a ground potential, namely, the circular arc-shaped ground electrode 38A, is exposed at the side surface of the sealing resin 36.

Accordingly, by providing the shielding member 39 so as to cover the external surface of the sealing resin 36 and connecting the shielding member 39 to the exposed circular arc-shaped ground electrode 38A, the semiconductor device 50 can be effectively and electromagnetically shielded by the shielding member 39 at the time of operation of the semiconductor device 50.

Thus, by providing the shielding member 39 so as to cover the external surface of the sealing resin 36, effective electromagnetic shielding can be achieved without causing an unnecessary increase of external dimensions of the semiconductor device 50.

At this time, with respect to a structure of the shielding member 39, timing of providing the shielding member 39, and correspondence to the heat sink, the same structure as that of the first embodiment can be applied.

Figure 8:
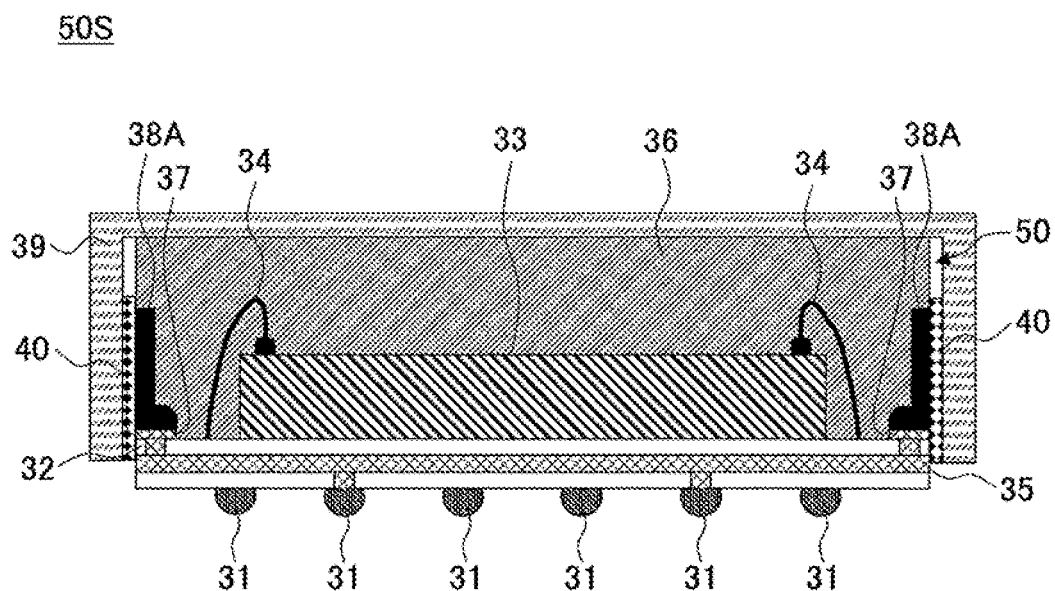
FIG. 8 is a cross-sectional view illustrating a shielding member provided to the semiconductor device of the second embodiment.

The shielding member 39 provided to the semiconductor device 50 having the above-discussed structure is illustrated in FIG. 8. The semiconductor device 50 having the shielding member 39 is illustrated as a semiconductor device 50S in FIG. 8.

The ground electrode 38A extends in a circular arc-shaped form along the side of the wiring board 32. Accordingly, a part of the ground electrode 38A extending in the height direction is illustrated in FIG. 8.

In other words, a box-shaped electromagnetic shielding member 39 (having a cross section of a rectangle without one side) is provided so as to cover the sealing resin 36 of the semiconductor device 50.

As discussed above, the electromagnetic shielding member 39 is made of a metal plate such as copper (Cu), aluminum (Al) or the like. The electromagnetic shielding member 39 may be made of another material such as resin and a metal covering may be formed on the surface of the electromagnetic shielding member 39.

An internal side surface and/or an internal bottom surface of the shielding member 39 and the surface of the sealing resin 36 are fixed to each other by an adhesive (not illustrated in FIG. 8).

In addition, the internal side surface of the shielding member 39 and a ground electrodes 38A led to the side surface of the sealing resin 36 of the semiconductor device 50 are connected to each other via adhesive members 40 made of a conductive adhesive such as solder or silver (Ag) paste so that electric conductance is made.

Under this structure, ground potential is applied to the shielding member 39 at the time of operations of the semiconductor device 50.

Under this structure, the ground electrode 38A comes in contact with or is connected to the shielding member 39 by the circular-arc shaped part of the ground electrode 38A. Accordingly, the ground electrode 38A and the shielding member 39 come in contact with each other with a wide contact area so that good electric connection is made.

A state where the semiconductor device 50 covered by the shielding member 39 is mounted on the wiring board (mother board) 41 is illustrated in FIG. 9.

The ground electrodes 38A extend in a circular arc-shaped form along the side of the wiring board 32. Accordingly, parts of the ground electrodes 38A extending in the height direction are illustrated in FIG. 9.

Referring to FIG. 9, in the semiconductor device 50S mounted on the wiring circuit board (mother board) 41 via the spherical-shaped bumps 31, the shielding member 39 covering the semiconductor device 50 is electrically connected to a ground wiring pattern 42 of the wiring circuit board 41.

In other words, under this structure, some spherical-shaped bumps 31 connected to the ground wiring pattern 35 of the wiring board 32 among plural spherical-shaped bumps 31 provided on the lower surface of the wiring board 32 of the semiconductor device 30 are connected to the ground wiring pattern 42 provided in the wiring circuit board 41.

In other words, the shielding member 39 covering the semiconductor device 50 is connected to the ground wiring pattern 42 of the wiring circuit board 41 via the adhesive member 40, the circular-arc shaped ground electrodes 38A, the electrode pads 37, the ground wiring pattern 35 of the wiring board 32, and the spherical shaped bumps 31 so that ground potential is applied. Accordingly, radiation of the electromagnetic waves generated from the semiconductor element 30 to the outside is blocked. Furthermore, influence of the electromagnetic waves from the outside atmosphere on the semiconductor device 50 is also prevented.

In the semiconductor device 50 of the second embodiment, the box-shaped electromagnetic shielding member 39 (having a cross section of a rectangle without one side) is provided so as to cover the surface of the sealing resin 36 of the semiconductor device 30. Accordingly, it is possible to miniaturize the wiring circuit board (mother board) 41.

The shielding member 39 is provided to each of the semiconductor devices 50. Since it is possible to provide a semiconductor device 50 which is shielded individually, there is no need to shield plural semiconductor devices 50, in a lump, mounted on the wiring circuit board 41. Accordingly, the freedom degree of design of the wiring circuit board 41 is increased so that miniaturization of the electronic device can be achieved.

In addition, it is possible to effectively radiate heat generated based on the operation of the semiconductor device 50 to the outside via the ground electrode 38A connected with a wider contact area and the metal shielding member 39. Therefore, it is possible to stably operate the semiconductor device 50.

Furthermore, as discussed above, in the semiconductor device 50, the ground electrode 38A and the shielding member 39 can be connected to each other with a wide contact area. Therefore, by connecting a single circular-arc shaped ground electrode 38A to the shielding member 39, it is possible to achieve the shielding effect. Accordingly, it is possible to manufacture the semiconductor device having the substantially same shielding effect by a smaller number of steps than for manufacturing the semiconductor device 30 of the first embodiment. If plural ground electrodes 38 are provided, it is possible to decrease electrical resistance so that stable electrical connection can be made and it is possible to achieve a further heat radiation effect.

In the second embodiment as well as the example illustrated in FIG. 5B, it is possible to provide the shielding member 39 to plural semiconductor devices 50 mounted on the wiring circuit board 41 in a lump (not illustrated).

3. Third Embodiment of the Semiconductor Device

Figure 10:
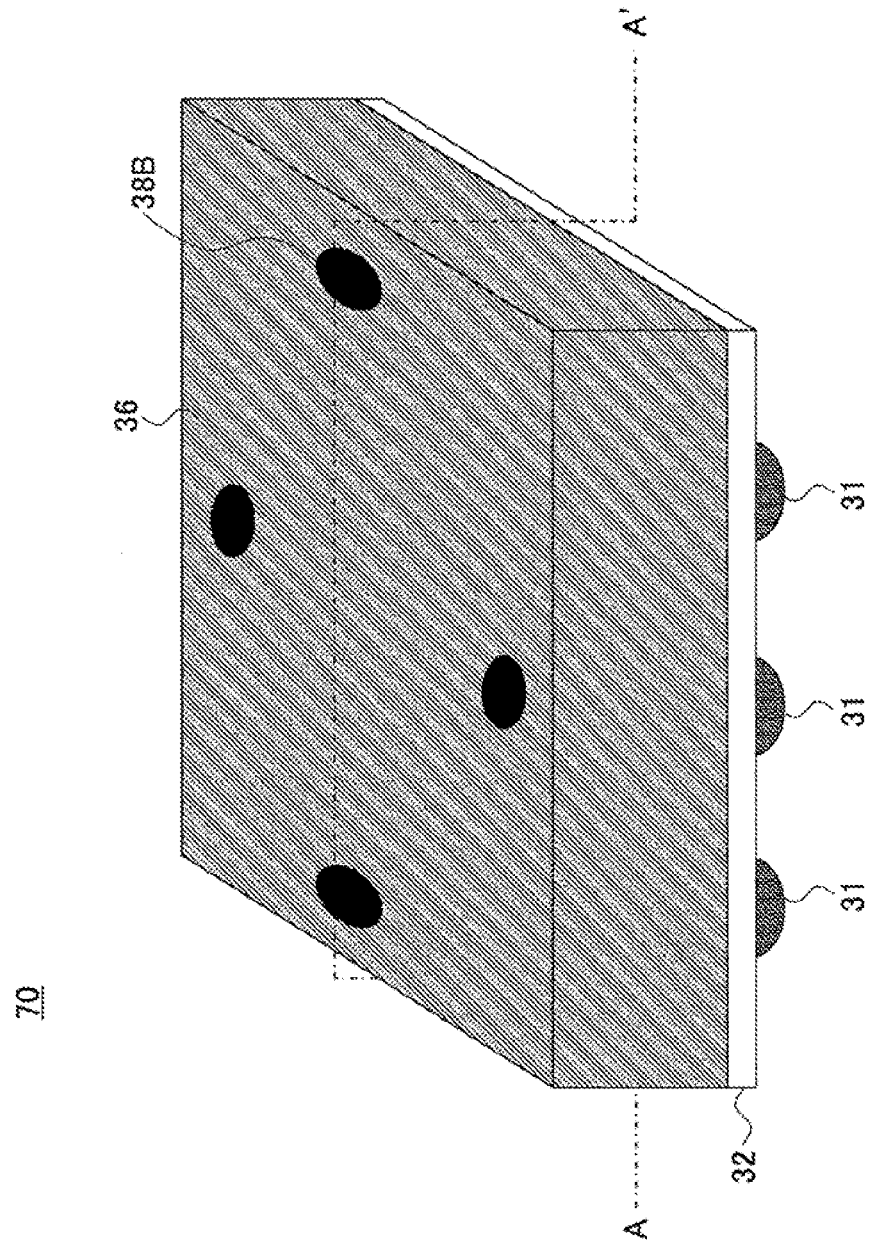
FIG. 10 is a perspective view of a semiconductor device of a third embodiment.
Figure 11:
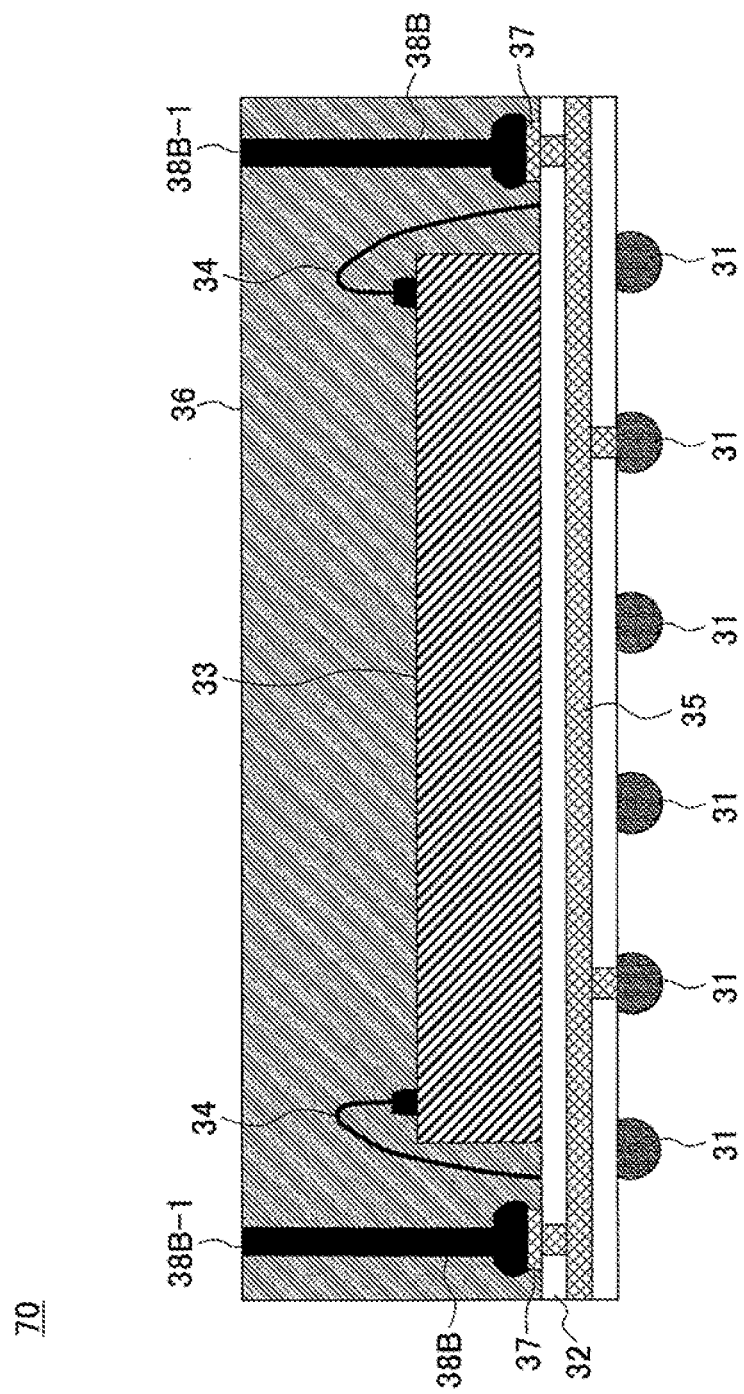
FIG. 11 is a cross-sectional view illustrating a structure of the semiconductor device of the third embodiment.

A semiconductor device of a third embodiment is illustrated in FIG. 10. A cross section of the semiconductor device is illustrated in FIG. 11. FIG. 11 is a cross section taken along a line A-A' of FIG. 10.

A semiconductor device 70 of the third embodiment is a so-called BGA (Ball Grid Array) type semiconductor device.

In the following explanation, parts that are the same as the parts discussed in the first embodiment are given the same reference numerals, and detailed explanation thereof is omitted.

In the semiconductor device 70 of the third embodiment, as illustrated in FIG. 10 and FIG. 11, columnar-shaped ground electrodes 38B are provided on and connected to the electrode pads 37 connected to the ground wiring pattern 35 and one is provided in the substantial center of each side of the wiring board 32. End parts 38B-1 of the ground electrodes 38B are exposed at an upper surface of the sealing resin 36.

In other words, the columnar-shaped ground electrode 38B made of a gold (Au) wire, a copper (Cu) wire, or the like extends on the electrode pad 37 in a substantially vertical manner so that the head end part 38B-1 is exposed at the upper surface of the sealing resin 36.

The ground electrode 38B is provided by, for example, a wire bonding method. The ground electrode 38B has a length whereby the head end part 38B-1 is exposed at the upper surface of the sealing resin 36 of the semiconductor device 70.

The ground electrode 38B can be formed by, in addition to the wire bonding method, a method where a columnar-shaped (stick-shaped) metal pin having a designated length stands on the electrode pad 37 or a method where plural ball bumps are stacked so that the ball bump at the top is exposed at the upper surface of the sealing resin 36.

In the third embodiment, a conductor has an end part connected to ground potential, namely, the end part 38B-1 of the ground electrode 38B is exposed at the top surface of the sealing resin 36.

Accordingly, by providing the shielding member 39 so as to cover the external surface of the sealing resin 36 and connecting the shielding member 39 to the ground electrode 38B, the semiconductor device 50 can be effectively and electromagnetically shielded by the shielding member 39 at the time of operation of the semiconductor device 50.

Thus, by providing the shielding member 39 so as to cover the external surface of the sealing resin 36, effective electromagnetic shielding can be achieved without causing an unnecessary increase of external dimensions of the semiconductor device 50.

With respect to a structure of the shielding member 39, timing of providing the shielding member 39, and correspondence to the heat sink, the same structure as that of the first embodiment can be applied.

Figure 12:
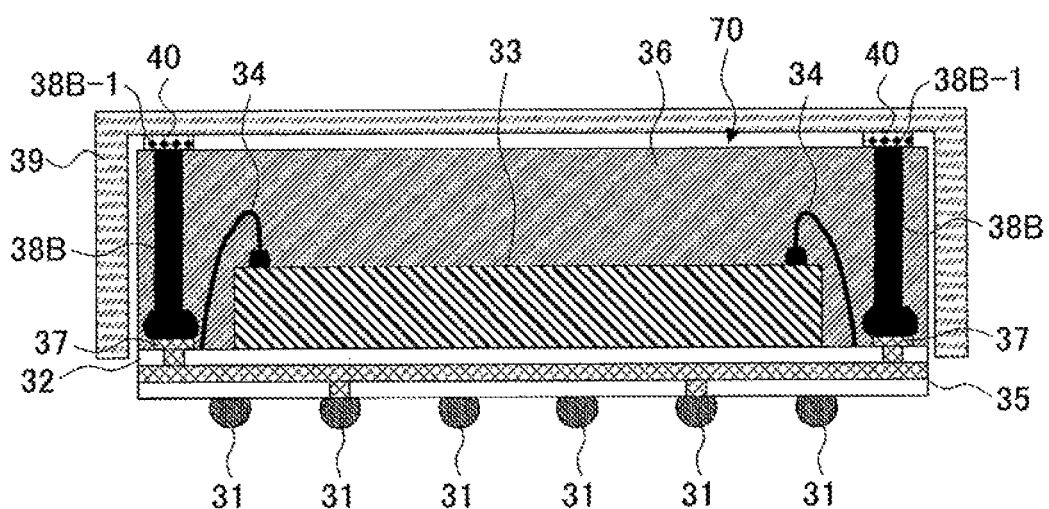
FIG. 12 is a cross-sectional view illustrating a shielding member provided to the semiconductor device of the third embodiment.

A state where the shielding member 39 is provided to the semiconductor device 70 having the above-discussed structure is illustrated in FIG. 12. The semiconductor device 70 having the shielding member 39 is illustrated as a semiconductor device 70S in FIG. 12.

In other words, a box-shaped electromagnetic shielding member 39 (having a cross section of a rectangle without one side) is provided so as to cover the sealing resin 36 of the semiconductor device 70.

As discussed above, the shielding member 39 is made of a metal plate such as copper (Cu), aluminum (Al) or the like. The electromagnetic shielding member 39 may be made of another material such as resin and a metal covering may be formed on the surface of the electromagnetic shielding member 39.

An internal side surface and/or an internal bottom surface of the shielding member 39 and the surface of the sealing resin 36 are fixed to each other by an adhesive (not illustrated in FIG. 12).

In addition, the internal side surface of the shielding member 39 and an end part 38B-1 of the ground electrode 38B led to the upper surface of the sealing resin 36 of the semiconductor device 70 are connected to each other via an adhesive member 40 made of a conductive adhesive such as solder or silver (Ag) paste so that electric conductance is made.

In other words, ground potential is applied to the shielding member 39 at the time of operations of the semiconductor device 70.

Under this structure, the end parts 38B-1 of the ground electrodes 38B are connected to the shielding member 39.

Figure 13:
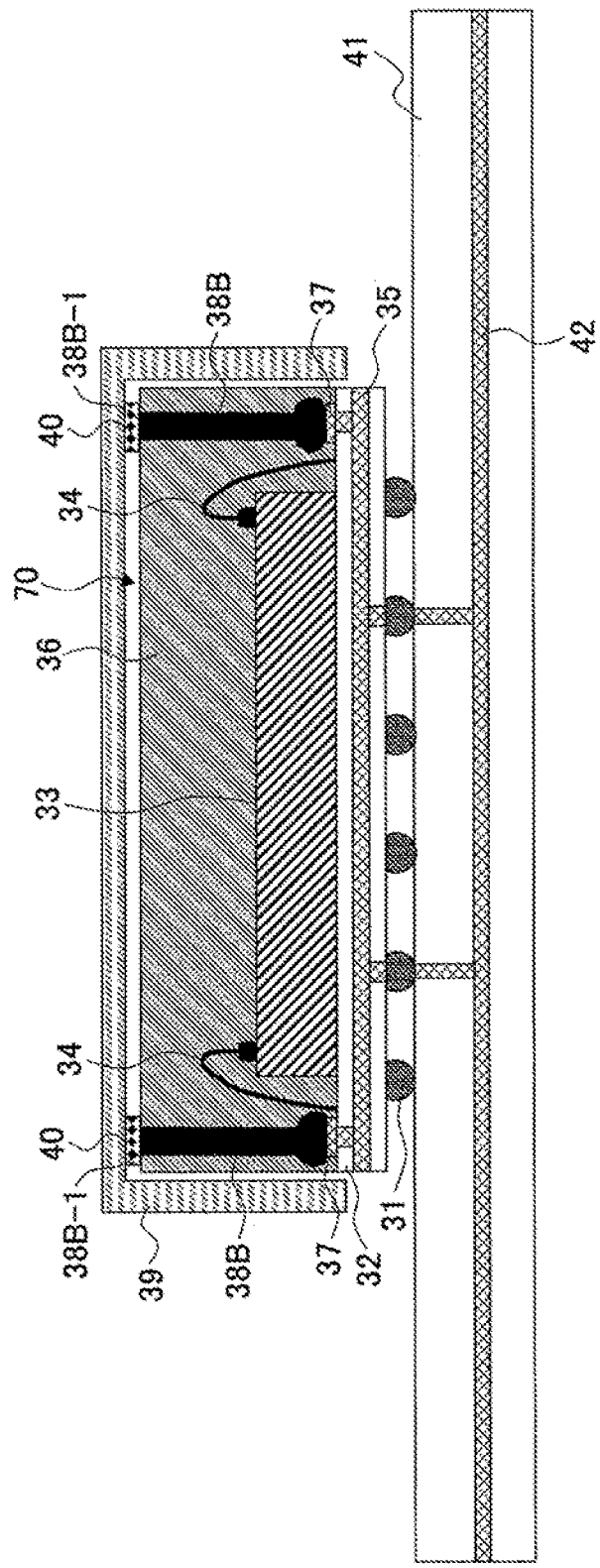
FIG. 13 is a cross-sectional view illustrating the semiconductor device of the third embodiment having the shielding member mounted on a wiring circuit board.
Figure 14:
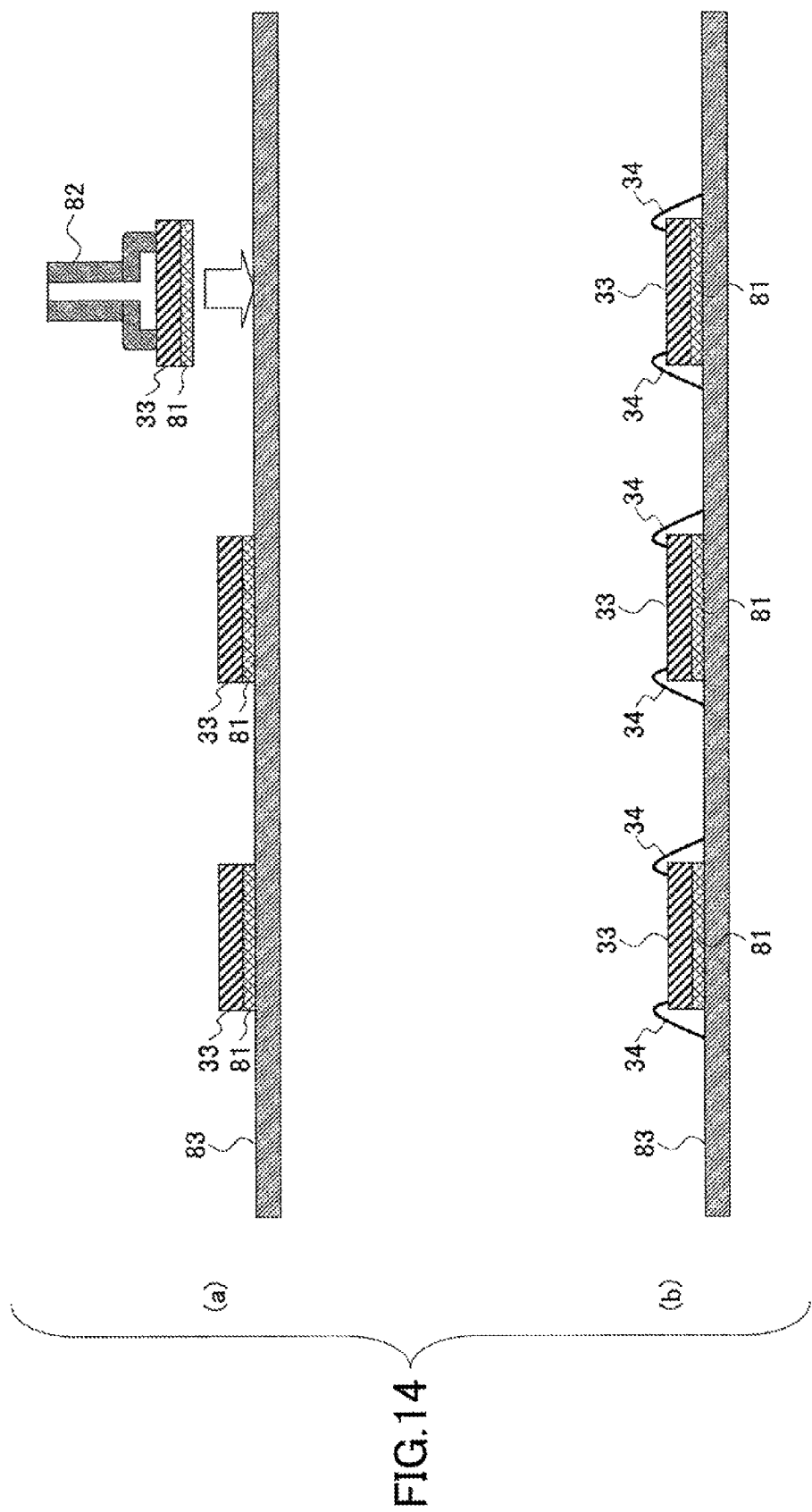
FIG. 14 is a first view for explaining a manufacturing method of the semiconductor device of the first embodiment.
Figure 15:
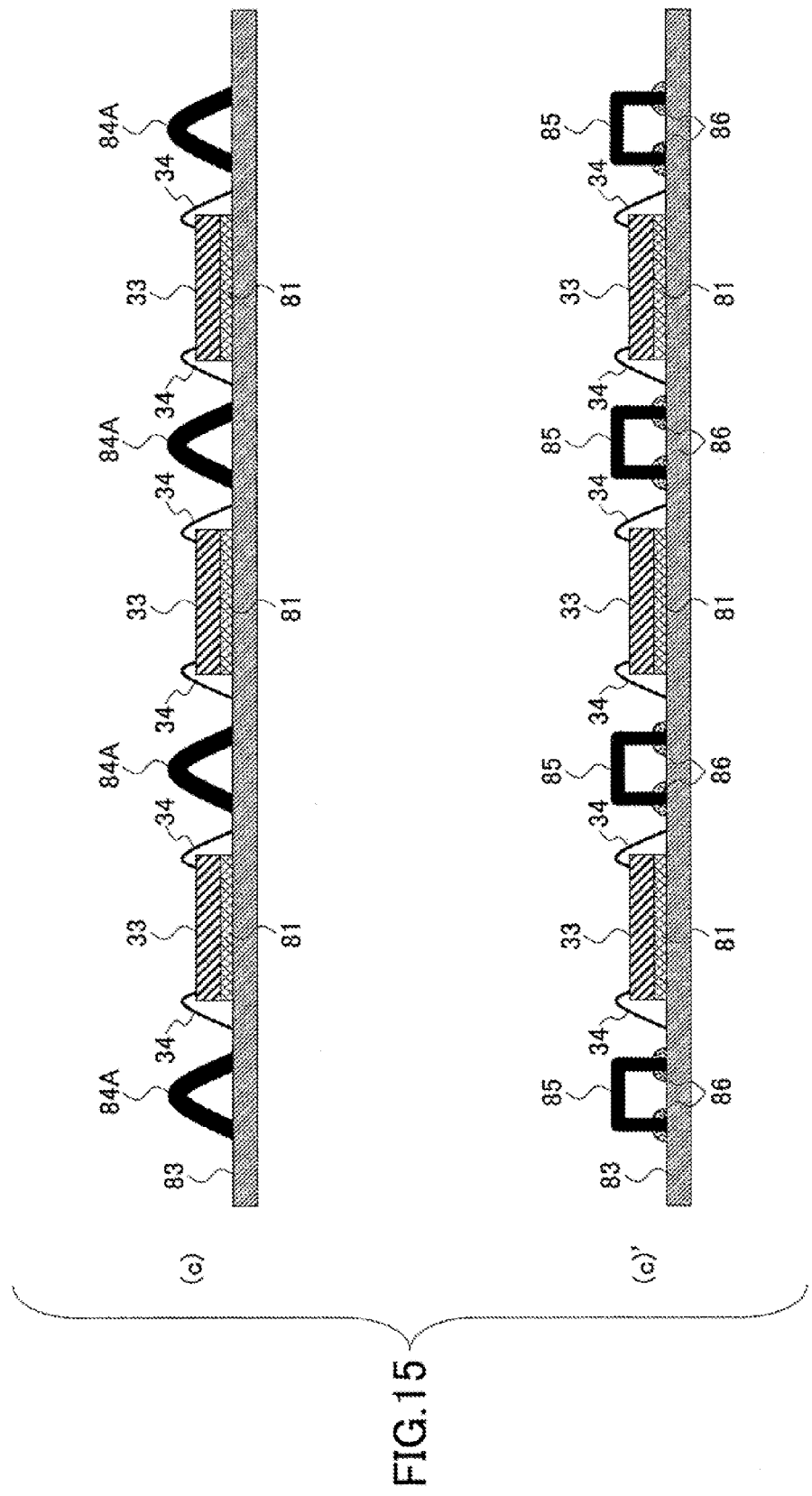
FIG. 15 is a second view for explaining the manufacturing method of the semiconductor device of the first embodiment.
Figure 16:
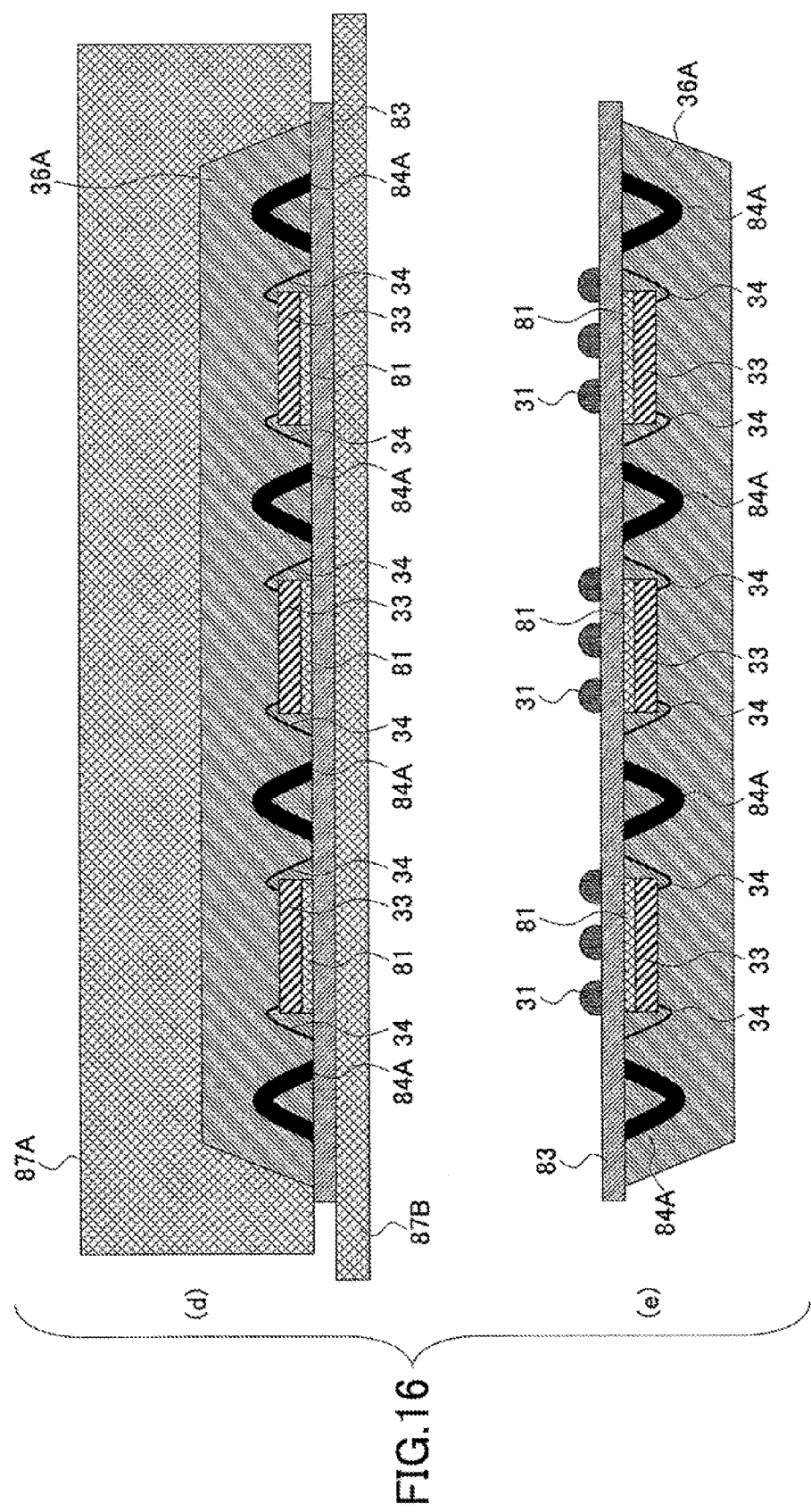
FIG. 16 is a third view for explaining the manufacturing method of the semiconductor device of the first embodiment.

A state where the semiconductor device 70 covered by the shielding member 39 and mounted on the wiring board (mother board) is illustrated in FIG. 13.

Referring to FIG. 13, in the semiconductor device 70S mounted on the wiring circuit board (mother board) 41 via the spherical-shaped bumps 31, the shielding member 39 covering the semiconductor device 70 is electrically connected to a ground wiring pattern 42 of the wiring circuit board 41.

In other words, under this structure, some spherical-shaped bumps 31 connected to the ground wiring pattern 35 of the wiring board 32 among plural spherical-shaped bumps provided on the lower surface of the wiring board 32 of the semiconductor device 70 are connected to the ground wiring pattern 42 provided in the wiring circuit board 41.

In other words, the shielding member 39 covering the semiconductor device 70 is connected to the adhesive 40, the ground electrodes 38B, the electrode pads 37, the ground wiring pattern 35 of the wiring board 32, and the spherical shaped bumps 31 so that ground potential is applied. Accordingly, radiation of the electromagnetic waves generated from the semiconductor element 70 to the outside is blocked. Furthermore, influence of the electromagnetic waves from the outside atmosphere on the semiconductor device 70 is also prevented.

In the semiconductor device 70 of the third embodiment, the box-shaped electromagnetic shielding member 39 (having a cross section of a rectangle without one side) is provided so as to cover the surface of the sealing resin 36 of the semiconductor device 70. Accordingly, it is possible to miniaturize the wiring circuit board (mother board) 41.

The shielding member 39 is provided to each of the semiconductor devices 70. Since it is possible to provide a semiconductor device 70 which is shielded individually, there is no need to shield plural semiconductor devices 70, in a lump, mounted on the wiring circuit board 41. Accordingly, the freedom degree of design of the wiring circuit board 41 is increased so that miniaturization of the electronic device 70 can be achieved.

In addition, it is possible to effectively radiate heat generated based on the operation of the semiconductor device 70 to the outside via the ground electrodes 38B connected with a wider contact area and the metal shielding member 39. Therefore, it is possible to stably operate the semiconductor device 70.

Furthermore, in the third embodiment, the ground electrode 38B is provided at each of four sides on the upper surface of the wiring board 32. There is no limitation of the number of the ground electrodes 38B to be provided as long as at least one ground electrode 38B is exposed at the upper surface of the sealing resin 36 and connected to the shielding member 39. If plural ground electrodes 38 are provided, it is possible to decrease electrical resistance so that stable electrical connection can be made and it is possible to achieve a further heat radiation effect.

In the third embodiment as well as the example illustrated in FIG. 5B, it is possible to provide the shielding member 39 to plural semiconductor devices 70 mounted on the wiring circuit board 41 in a lump (not illustrated). In the semiconductor device 30 of the first embodiment and the semiconductor device 70 of the third embodiment, depending on the circuit structure and/or the function of the semiconductor element, the ground electrode pads 37 may be arranged in line on the same line as the line of the electrode pads where the bonding wires 34 are connected (not illustrated). By this electrode pad arrangement structure, it is possible to miniaturize the semiconductor element and the semiconductor device.

<Manufacturing Method of Semiconductor Device>

Next, manufacturing methods of the semiconductor devices 30, 50 and 70 of the embodiments are discussed. In drawings referred to in the following explanation, illustrations of detailed structures of the wiring board 32 and the wiring circuit board (mother board) 41 are omitted.

1. First Example of the Manufacturing Method of the Semiconductor Device

A manufacturing method of the semiconductor device of the first embodiment is discussed with reference to FIG. 14 through FIG. 23.

First, a main surface (a surface where an electronic circuit element and an electronic circuit are formed) of the semiconductor element 33 having a rear surface where die bonding material 81 such as a die bonding film is adhered and held by an absorbing collet 82. The semiconductor element 33 adhered and held by the absorbing collet 82 is mounted on and fixed to, via the die bonding material 81, a large size board 83 which will become the wiring board 32. See FIG. 14(*a*). Plural semiconductor elements 33 are mounted on and fixed to the board 83.

The electrode pads of the semiconductor element 33 and the electrode pads of the board 83 (not illustrated) provided so as to correspond to the electrode pads of the semiconductor element 33 are connected to each other by using the bonding wires 34. See FIG. 14(*b*). At this time, in an area situated outside the electrode pads to which the bonding wires 34 are connected on the upper surface of the board 83, namely in a position far from the semiconductor elements 33, bonding wires 84A are provided in a loop shape so as to connect to electrode pads (not illustrated) connected to the ground wiring pattern 35 in an area where the neighboring semiconductor elements 33 are mounted. See FIG. 15(*c*). In a case where the loop-shaped bonding wire 84A has the same diameter as that of the bonding wire 34 and is formed of the same material as that of the bonding wire 34, the loop-shaped bonding wire 84A can be formed in the same wire boding step.

The loop shaped bonding wires 84A are cut between the areas of the semiconductor devices 33 in a later step so that the ground electrodes 38 are formed.

The ground electrode 38 may be formed by using the conductive member 85 such as a metal plate or metal stick having a configuration of a rectangle without one side, in addition to the bonding wire 84A. In this case, the conductive member 85 connects, like a bridge, the electrode pads connected to the ground wiring pattern 35. See FIG. 15(*c*)'. In any case, while the diameter of the bonding wire 34 is, for example, approximately 18 μm through approximately 30 μm, the diameter of the ground electrode 38 is substantially equal to or greater than the diameter of the bonding wire 34. For example, the diameter of the ground electrode 38 is approximately 100 μm through approximately 500 μm.

Next, plural semiconductor elements 33 mounted on the board 83, the bonding wires 34 connected to the semiconductor elements 33, the ground electrodes 38, and others are sealed by the sealing resin 36A. See FIG. 16(*d*). At this time, plural semiconductor elements 33 mounted on and fixed to the main surface of the board 83, the bonding wires 34 connected to the semiconductor elements 33, the loop-shaped bonding wires 84A, and others are sealed in a lump.

A compression molding method or a so-called transfer molding method using molds 87 (an upper mold 87A and a lower mold 87B) may be applied to this resin sealing process.

After that, solder balls 31 as outside connection terminals, corresponding to plural semiconductor elements 33, are provided on another main surface (rear surface) of the board 83. See FIG. 16(*e*). Next, the board 83 and the sealing resin 36A are cut in their thickness directions at the substantially center part in the length direction of the loop-shaped bonding wires 84A (or the conductive members 85 such as the metal plate or metal stick having a configuration of a rectangle without one side). See FIG. 17(*f*). In this cutting process, the semiconductor element 33 sealed by the sealing resin 36A on the main surface of the board 83, the bonding wires 34 connected to the semiconductor element 33, and others are treated as a single unit. A blade dicing method using a dicing saw 88 may be used as a cutting method. A so called laser dicing method also may be used.

As a result of this, the semiconductor device 30 is formed where the semiconductor element 33, the bonding wires 34 connected to the semiconductor element 33, the ground electrodes 38, and others are provided on the main surface of the wiring board 32 and sealed by the sealing resin 36. See FIG. 17(*g*). In the semiconductor device 30, the end part 38-1 of the ground electrode 38 formed by cutting the bonding wire 84A is exposed at the side surface of the sealing resin 36. On the other hand, the solder balls 31 as the outside connection terminals are provided on another main surface of the wiring board 32.

The shielding member is provided to the semiconductor device 30 having the above-discussed structure.

The adhesive member 40 made of a conductive adhesive such as solder or silver (Ag) paste is selectively provided to the end part 38-1 of the ground electrode 38 exposed at the side surface of the sealing resin 36 by using a dispensing method, a screen printing method, or the like. See FIG. 18(*h*). Next, the shielding member 39 formed by a box-shaped metal body (having a cross section of a rectangle without one side) is provided so as to cover the sealing resin 36. See FIG. 18(*i*). At this time, by providing adhesive 89 on the internal bottom surface of the shielding member 39 in advance, the shielding member 39 is fixed to the sealing resin 36 by the adhesive 89.

Of course, it is possible to provide the adhesive 89 on the upper surface of the sealing resin 36 in advance.

Next, a heating process is applied in this state so that the end part 38-1 of the ground electrode 38 and the shielding member 39 are connected to each other by the adhesive 40. See FIG. 19(*j*). Here, as a heating method, a method for selectively heating a portion of the side surface of the shielding member 39, the portion being where the end part 38-1 of the ground electrode 38 is positioned, may be applied. In addition, in a case where the adhesive 40 is made of solder, heating may be applied by reflow. In a case where the adhesive 40 is made of conductive adhesive such as silver (Ag) paste, a high temperature tank is used so that heat hardening may take place.

Thus, the semiconductor device 30S having the shielding member 39 covering the sealing resin 36 is formed.

In the semiconductor device 30S, the shielding member 39 can be connected to the ground wiring pattern 42 or the like of the wiring circuit board (mother board) 41 via the adhesive member 40, the ground electrodes 38, the electrode pads 37, the ground wiring pattern 35 of the wiring board 32, and the spherical-shaped bumps 31. Therefore, the semiconductor device 30 can be effectively shielded.

A method of arranging the shielding member 39 to cover the semiconductor device 30 is not limited to the above-mentioned method. For example, a method illustrated in FIG. 20 and FIG. 21 may be applied so that the semiconductor device 30S is formed.

Figure 17:
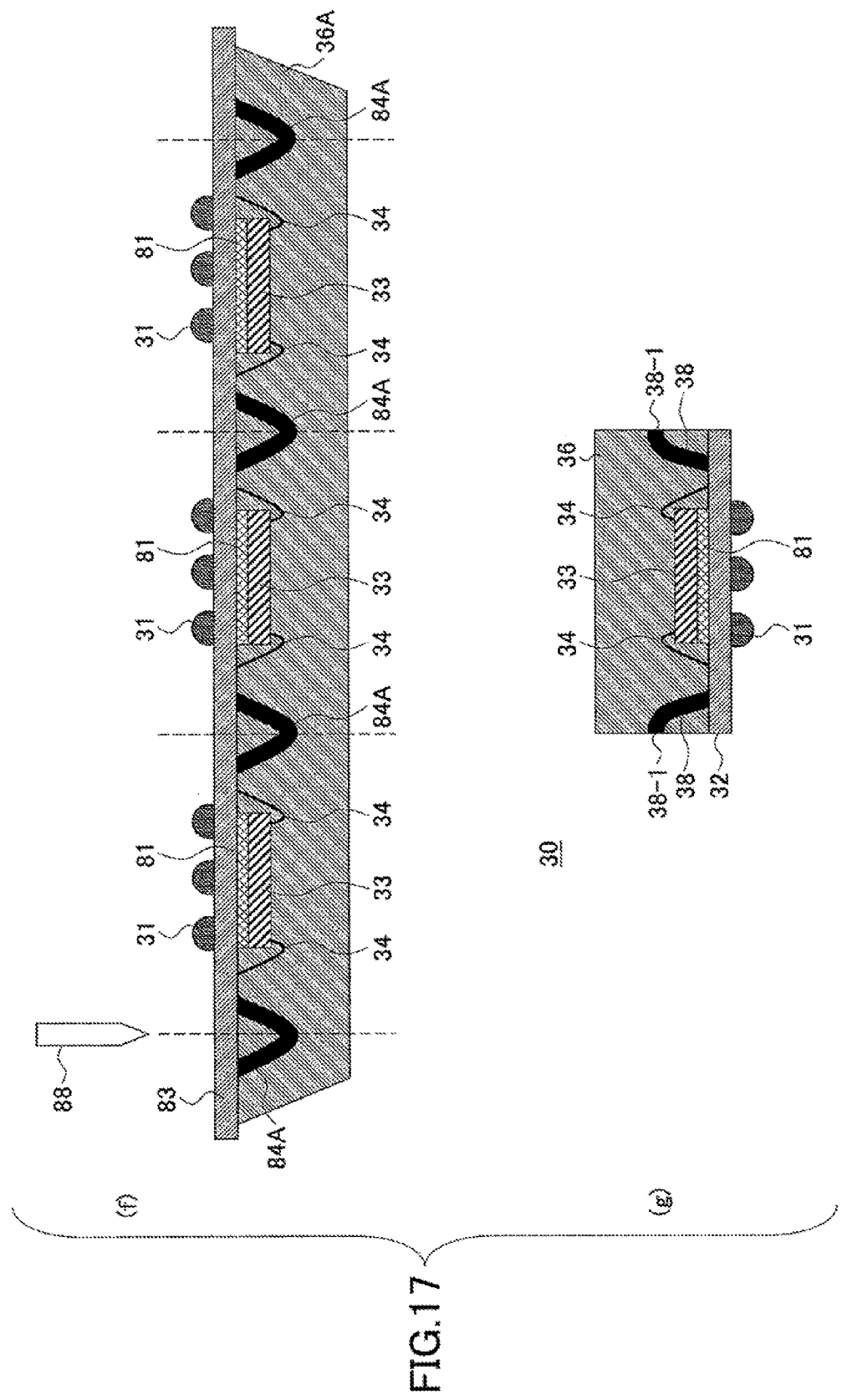
FIG. 17 is a fourth view for explaining the manufacturing method of the semiconductor device of the first embodiment.
Figure 18:
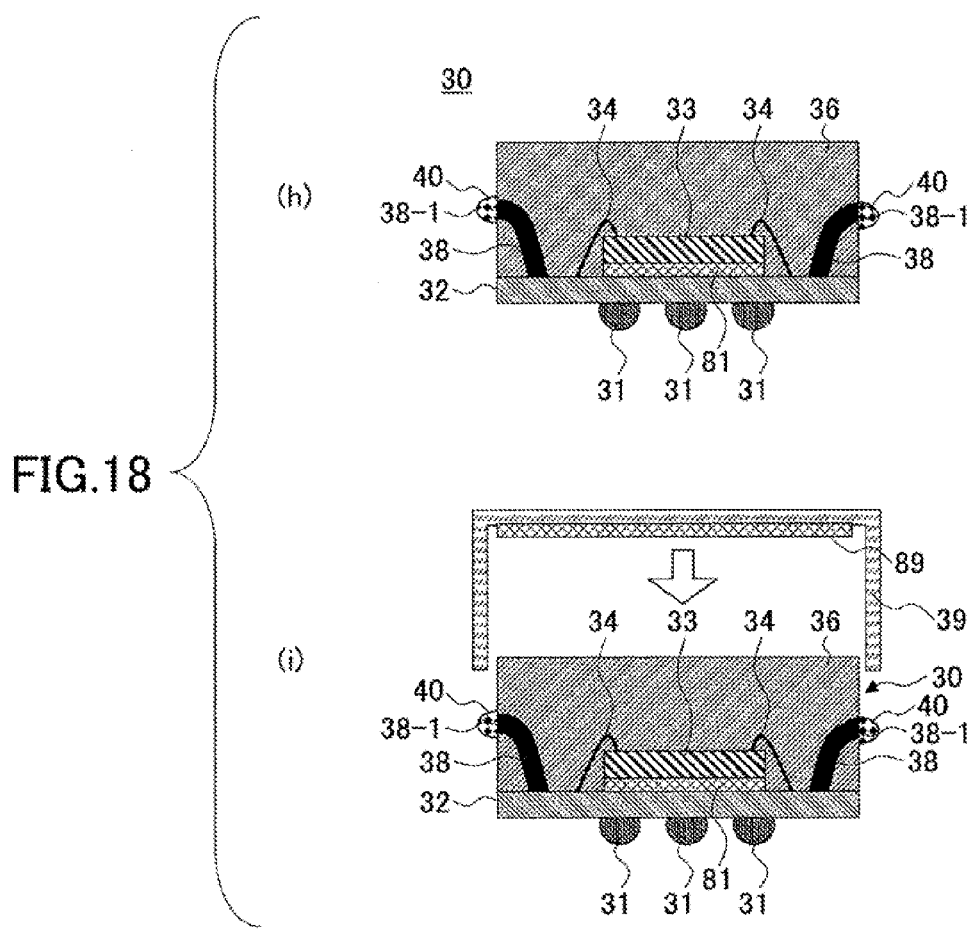
FIG. 18 is a fifth view for explaining the manufacturing method of the semiconductor device of the first embodiment.
Figure 19:
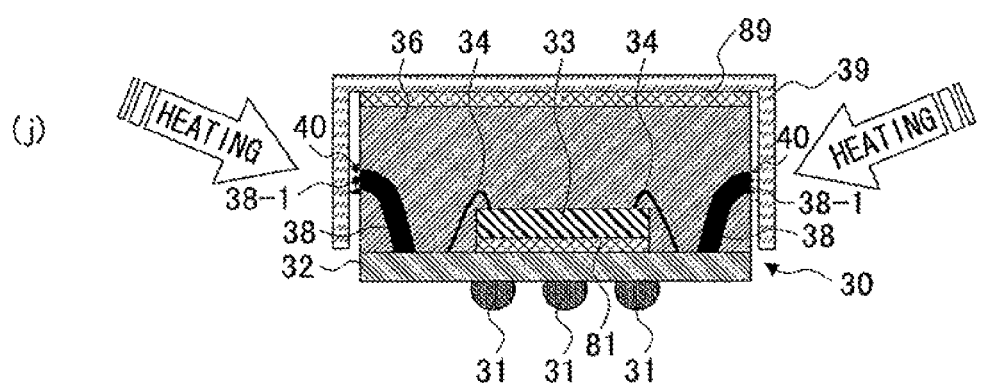
FIG. 19 is a sixth view for explaining the manufacturing method of the semiconductor device of the first embodiment.
Figure 20:
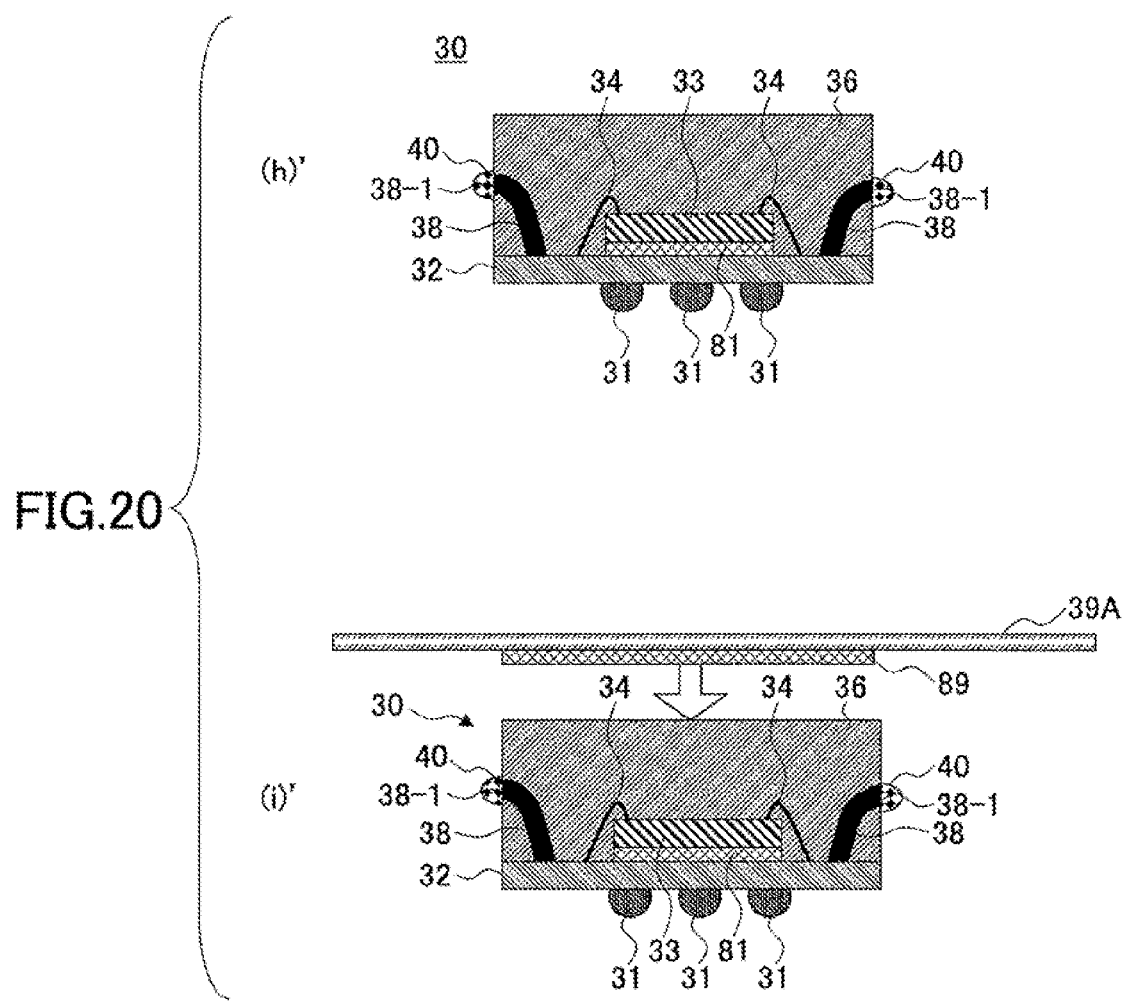
FIG. 20 is a seventh view for explaining the manufacturing method of the semiconductor device of the first embodiment.
Figure 21:
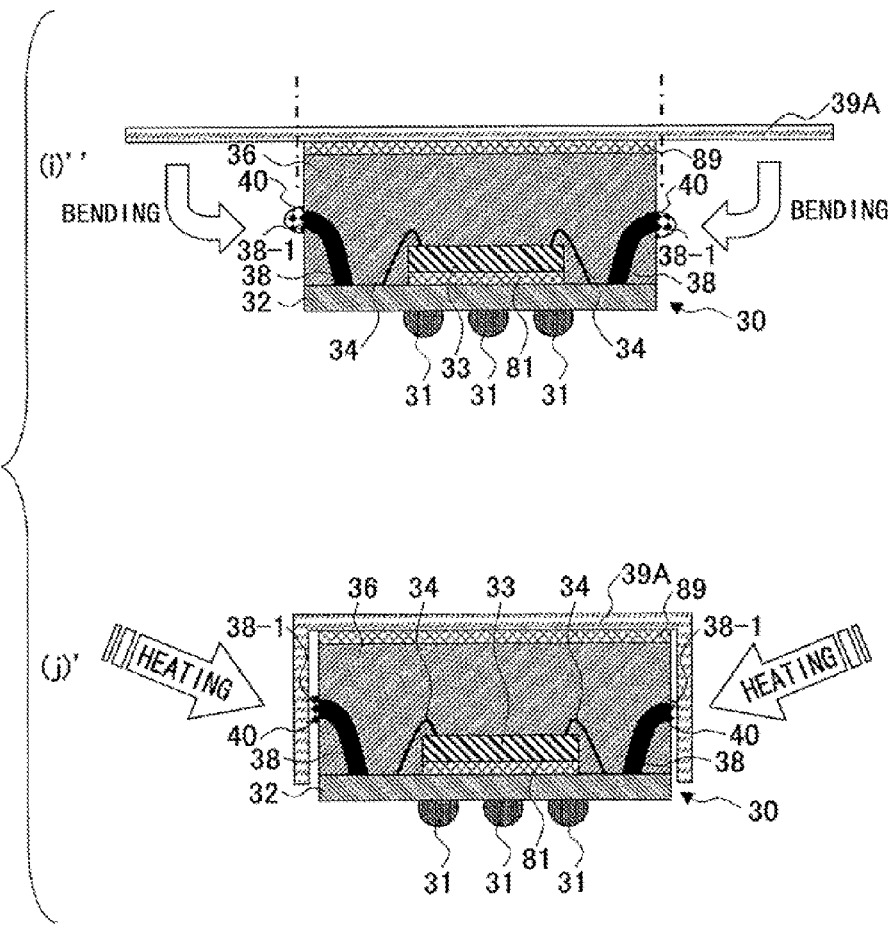
FIG. 21 is an eighth view for explaining the manufacturing method of the semiconductor device of the first embodiment.

That is, after the step illustrated in FIG. 17(*g*), the adhesive member 40 made of a conductive adhesive such as solder or silver (Ag) paste is provided to the end part 38-1 of the ground electrode 38 exposed at the side surface of the sealing resin 36 by a using dispensing method, a screen printing method, or the like. See FIG. 20(*h*)'. Next, a plate-shaped or a foil metal shielding member 39A having a substantially cross-shaped configuration is arranged on the upper surface of the sealing resin 36 of the semiconductor device 30. See FIG. 20(*i*)'. At this time, by selectively providing the adhesive 89 in advance on the shielding member 39A coming in contact with the upper surface of the sealing resin 36, the shield member 39A is fixed to the upper surface of the sealing resin 36 via the adhesive 89.

Next, the plate-shaped or the foil shielding member 39A is bent along the external side surfaces of the sealing resin 36 so as to be in parallel with the side surfaces. See FIG. 21(*i*)". As a result of this, the shield member 39 having a cross section of a rectangle without one side is formed.

After that, a heating process is applied to the semiconductor device where the shielding member 39 is fixed. See FIG. 21(*j*)'. As a result of this, the end parts 38-1 of the ground electrodes 38 and the shielding member 39 are connected to each other via the adhesive material 40. Here, as a heating method, the same method as that discussed with reference to FIG. 19(*j*) may be used.

A method of arranging the shielding member 39 on the semiconductor device 30 is not limited to the above-mentioned method. For example, a method illustrated in FIG. 22 and FIG. 23 may be applied so that the semiconductor device 30S is formed.

That is, after the step illustrated in FIG. 17(*g*), the metal shielding member 39 having a cross section of a rectangle without one side is provided from an upper part of the sealing resin 36 of the semiconductor device 30. See FIG. 22. At this time, the connection projection parts 39B are provided at parts of the internal side surface of the shielding member 39, the parts corresponding to the end surfaces 38-1 of the ground electrodes 38 exposed at the side surfaces of the sealing resin 36. In addition, the length L between the connection projection parts 39B facing each other is substantially equal to or slightly shorter than the external dimension P of the semiconductor device 30. In addition, the adhesive 40 is provided on the internal bottom surface of the shielding member 39.

That is, by providing the shielding member 39 from an upper part of the sealing resin 36 of the semiconductor device 30, at the side surfaces of the sealing resin 36, the end parts 38-1 of the ground electrodes 38 and the connection projections 39B of the shielding member 39 come in contact and are connected to each other.

That is, the shielding member 39 is fixed to the upper surface of the sealing resin 36 via the adhesive 89 provided in advance on the internal bottom surface of the shielding member 39. See FIG. 23. In this example, the end part 38-1 of the ground electrode 38 and the connection projection 39B provided on the internal side surface of the shielding member 39 are mechanically in contact with each other. In addition to this structure, the adhesive member 40 made of a conductive adhesive such as solder or silver (Ag) paste may be provided on the end parts 38-1 of the ground electrodes 38 by using a dispensing method, a screen printing method, or the like, so that connection can be strengthened by the adhesive member 40.

In addition, as discussed above, the plate-shaped shielding member 39 may be bent so as to be substantially in parallel with the side surface of the sealing resin 36, so that the end parts 38-1 of the ground electrodes 38 and the corresponding connection projection parts 39B of the shielding member 39 may be mechanically connected to each other.

Thus, according to the manufacturing method of this example, it is possible to provide the ground electrodes 38 with a simple step and connection with the shielding member 39 can be easily made.

In particular, in a case where the ground electrodes 38 are formed by the wire bonding method, it is possible to provide the ground electrodes 38 by the same step as the step of providing the bonding wires 34, and therefore it is possible to simplify the manufacturing process.

2. Second Example of the Manufacturing Method of the Semiconductor Device

A manufacturing method of the semiconductor device of the second embodiment is discussed with reference to FIG. 24 through FIG. 27.

In the drawings mentioned below, parts that are the same as the parts depicted in FIG. 14 through FIG. 23 are given the same reference numerals, and explanation thereof is omitted.

First, a main surface (a surface where an electronic circuit element and an electronic circuit are formed) of the semiconductor element 33 having a rear surface where the die bonding material 81 such as a die bonding film is adhered and held by an absorbing collet 82. The semiconductor element 33 absorbed and held by the absorbing collet 82 is mounted on and fixed to, via the die bonding material 81, a large size board 83 which will become the wiring board 32. See FIG. 24(*a*). Plural semiconductor elements 33 are mounted on and fixed to the board 83.

The electrode pads of the semiconductor elements 33 and the electrode pads (not illustrated) of the board 83 (not illustrated) provided so as to correspond to the electrode pads of the semiconductor elements 33 are connected to each other by using the bonding wires 34. See FIG. 24(*b*)1. At this time, in an area situated outside the electrode pads to which the bonding wires 34 are connected on the upper surface of the board 83, namely in a position far from the semiconductor elements 33, the bonding wires 84B are provided in a loop shape so as to connect the electrode pads (not illustrated) connected to the ground wiring pattern 35 in an area where the neighboring semiconductor elements 33 are mounted. See FIG. 24(*b*)1. In other words, the loop-shaped bonding wires 84B are positioned on the boundary with a mounting area of neighboring other semiconductor elements 33 at four sides of each semiconductor element 33 and extend in parallel with the boundary. See FIG. 24(*b*)2. In a case where the loop shaped bonding wire 84B has the same diameter as that of the bonding wire 34 and is formed of the same material as that of the bonding wire 34, the loop shaped bonding wires 84B can be formed in the same wire bonding step.

The loop shaped bonding wires 84B are cut between the areas of the semiconductor devices 50 in a later step so that the ground electrodes 38 are formed.

The ground electrodes 38 may be formed by using the conductive member 85 such as a metal plate or metal stick having a configuration of a rectangle without one side, in addition to the bonding wire 84B. In this case, the conductive member 85 connects, like a bridge, the electrode pads connected to the ground wiring pattern 35. See FIG. 15(*c*)'.

In any case, while the diameter of the bonding wire 34 is, for example, approximately 18 μm through approximately 30 μm, the diameter of the ground electrode 38 is substantially equal to or greater than a diameter of the bonding wire 34. For example, the diameter of the ground electrode 38 is approximately 100 μm through approximately 500 μm.

Next, plural semiconductor elements 33 mounted on the board 83, the bonding wires 34 connected to the semiconductor elements 33, the bonding wires 84B, and others are sealed by the sealing resin 36A. See FIG. 25(c). At this time, plural semiconductor elements 33 mounted on and fixed to the main surface of the board 83, the bonding wires 34 connected to the semiconductor elements 33, the bonding wires 84B, and others are sealed in a lump.

A compression molding method or a so-called transfer molding method using molds 87 (an upper mold 87A and a lower mold 87B) may be applied to this resin sealing process.

After that, solder balls 31 as outside connection terminals, corresponding to plural semiconductor elements 33, are provided on another main surface (rear surface) of the board 83. See FIG. 25(d). Next, the board 83 and the sealing resin 36A are cut in their thickness directions at the substantially center part in the length direction of the loop shaped bonding wire 84B (or the conductive member 85 such as the metal plate or metal stick having a configuration of a rectangle without one side). See FIG. 26(e). In this cutting process, the semiconductor element 33 sealed by the sealing resin 36A on the main surface of the board 83, the bonding wires 34 connected to the semiconductor element 33, and others are treated as a single unit. A blade dicing method using a dicing saw 88 may be used as a cutting method. A so called laser dicing method also may be used.

At this time, the dicing process is applied to the boundary part of the circuit board where the neighboring semiconductor elements 33 are mounted. Therefore, the loop-shaped bonding wire 84B provided at the boundary part (or the conductive member 85 such as the metal stick and the metal plate having a configuration of a rectangle without one side) is cut along the length direction and at the substantially center part in the width (diameter) direction.

As a result of this, the semiconductor device 50 is formed where the semiconductor element 33, the bonding wires 34 connected to the semiconductor element 33, the bonding wires 84B, and others are provided on the main surface of the wiring board 32 and sealed by the sealing resin 36. See FIG. 26(f). In the semiconductor device 50, the ground electrode 38 formed by cutting the bonding wire 84B in the length direction is provided so that the width (diameter) cross section of the bonding wire 84B is exposed in the loop shape at the side surface of the sealing resin 36. On the other hand, the solder balls 31 as the outside connection terminals are provided on another main surface of the wiring board 32.

Next, the box-shaped metal shielding member 39 having a cross section of a rectangle without one side is provided so as to cover the sealing resin 36. See FIG. 27. Thus, the semiconductor device 50S having the shielding member 39 covering the sealing resin 36 is formed.

Figure 22:
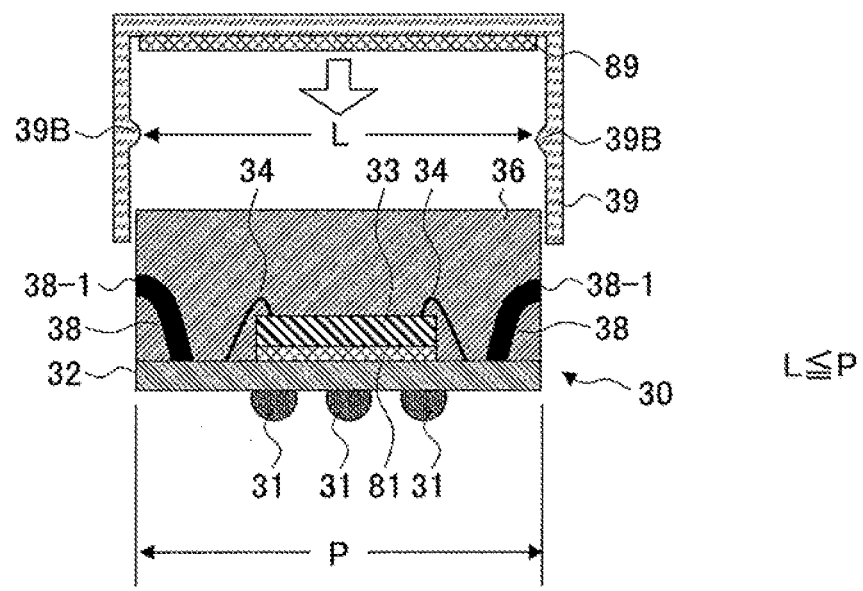
FIG. 22 is a ninth view for explaining the manufacturing method of the semiconductor device of the first embodiment.
Figure 23:
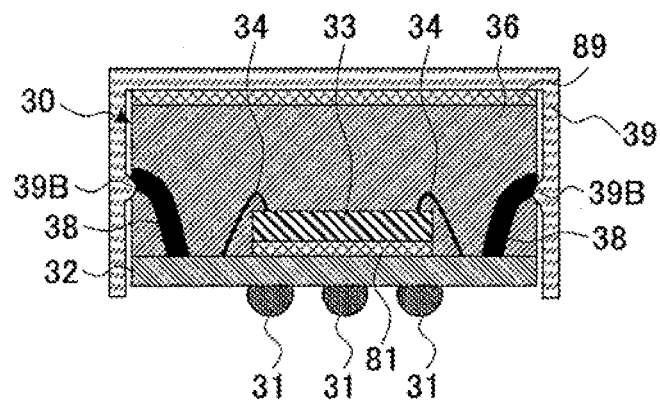
FIG. 23 is a tenth view for explaining the manufacturing method of the semiconductor device of the first embodiment.
Figure 24:
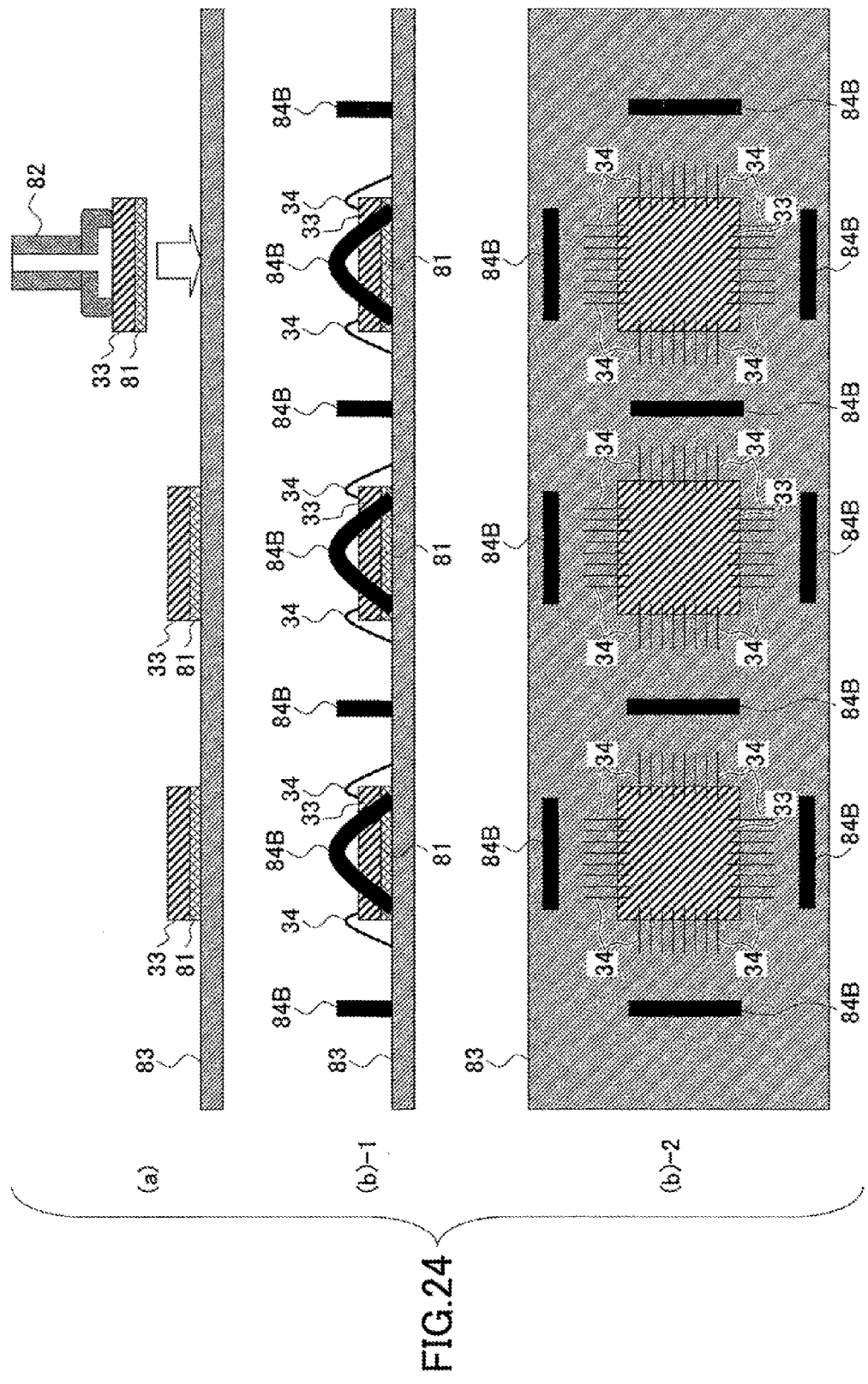
FIG. 24 is a first view for explaining a manufacturing method of the semiconductor device of the second embodiment.
Figure 25:
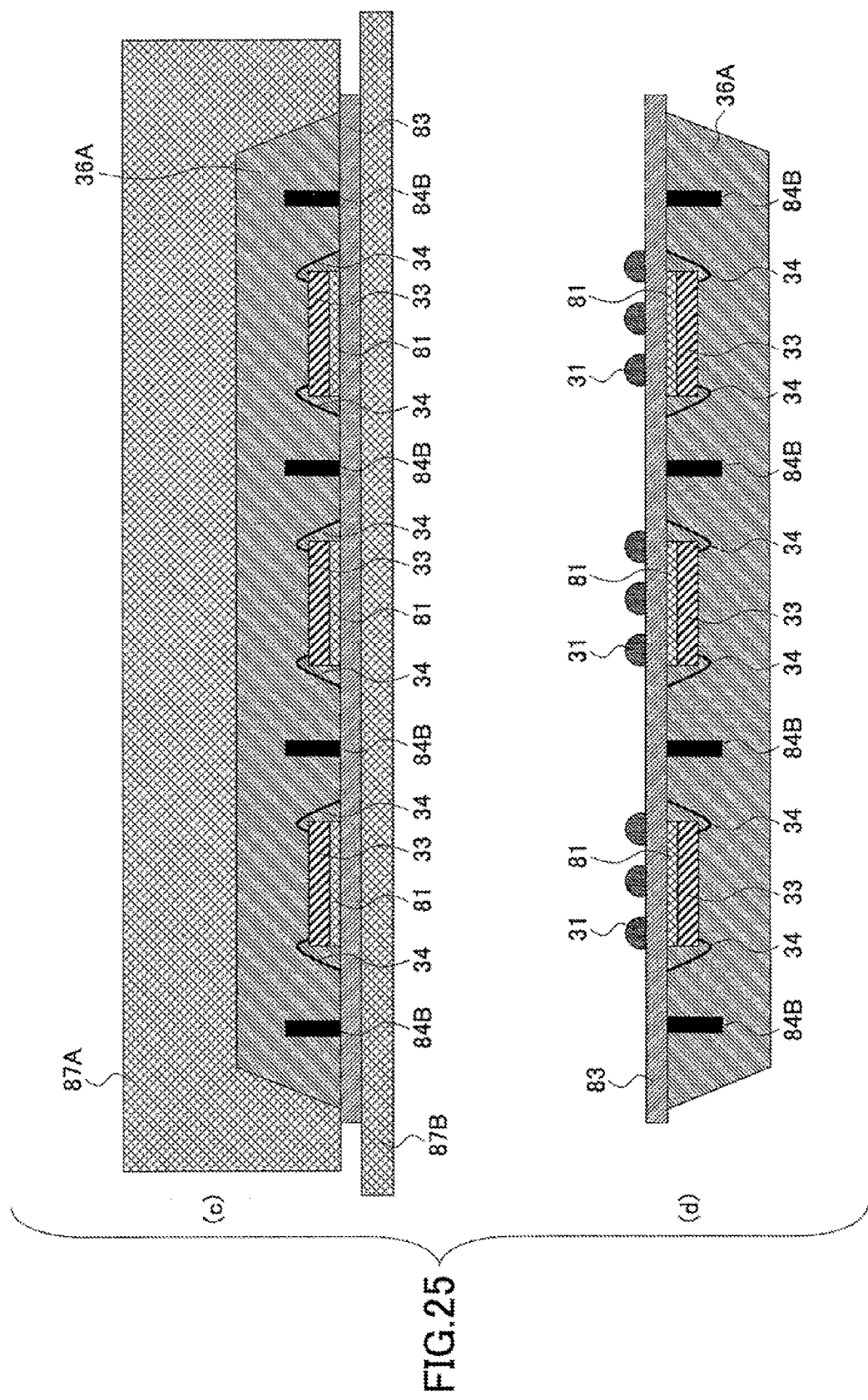
FIG. 25 is a second view for explaining the manufacturing method of the semiconductor device of the second embodiment.
Figure 26:
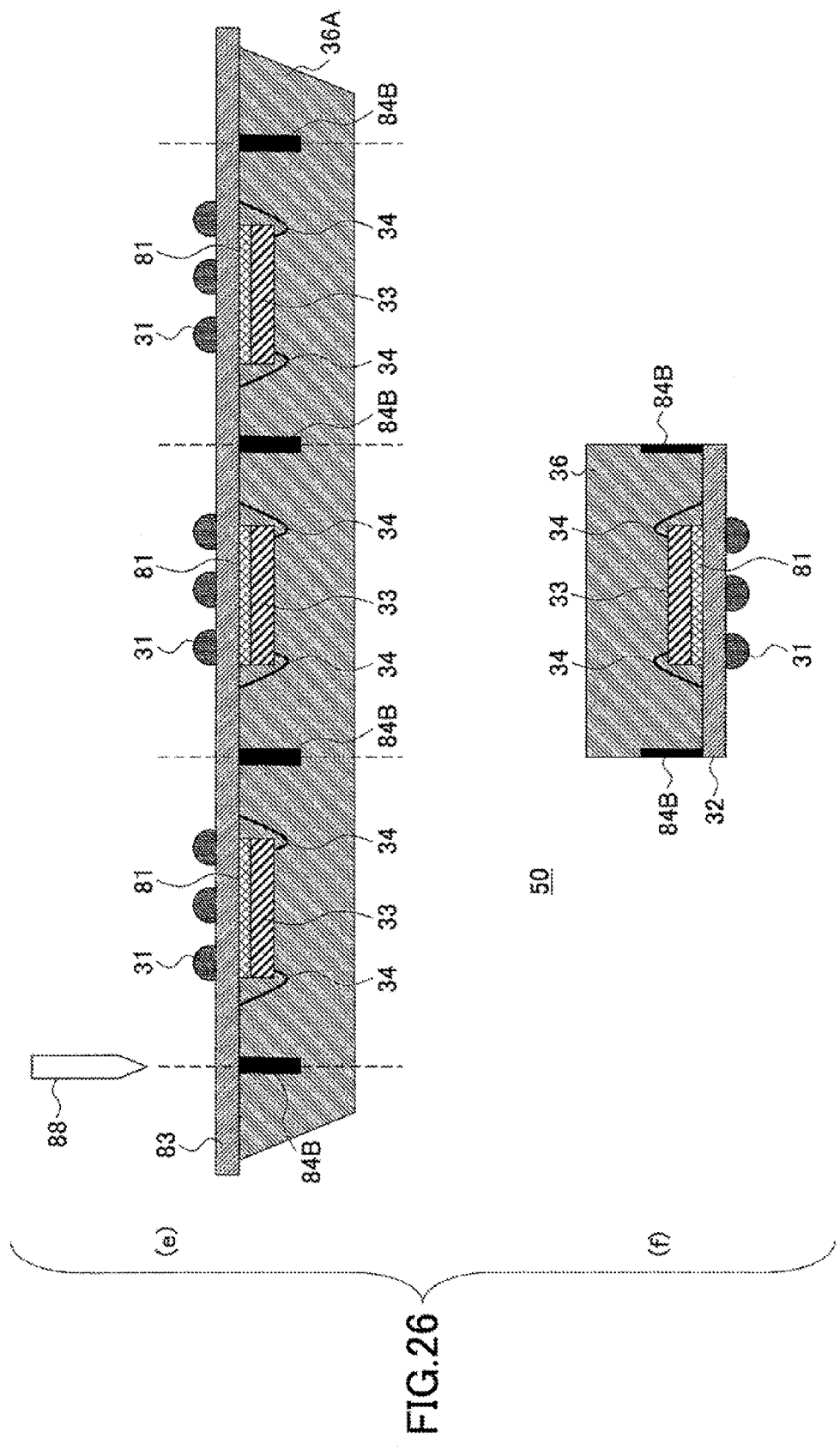
FIG. 26 is a third view for explaining the manufacturing method of the semiconductor device of the second embodiment.
Figure 27:
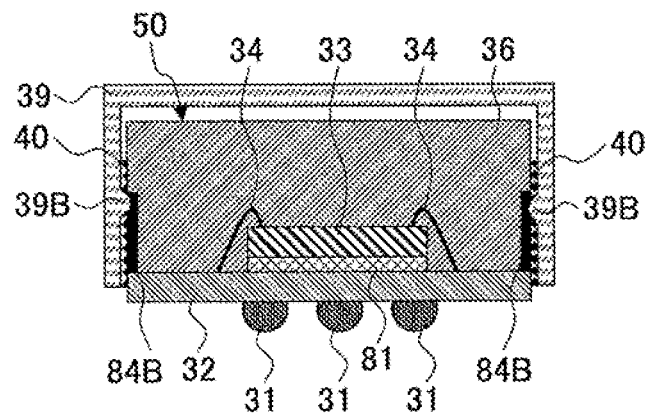
FIG. 27 is a fourth view for explaining the manufacturing method of the semiconductor device of the second embodiment.
Figure 28:
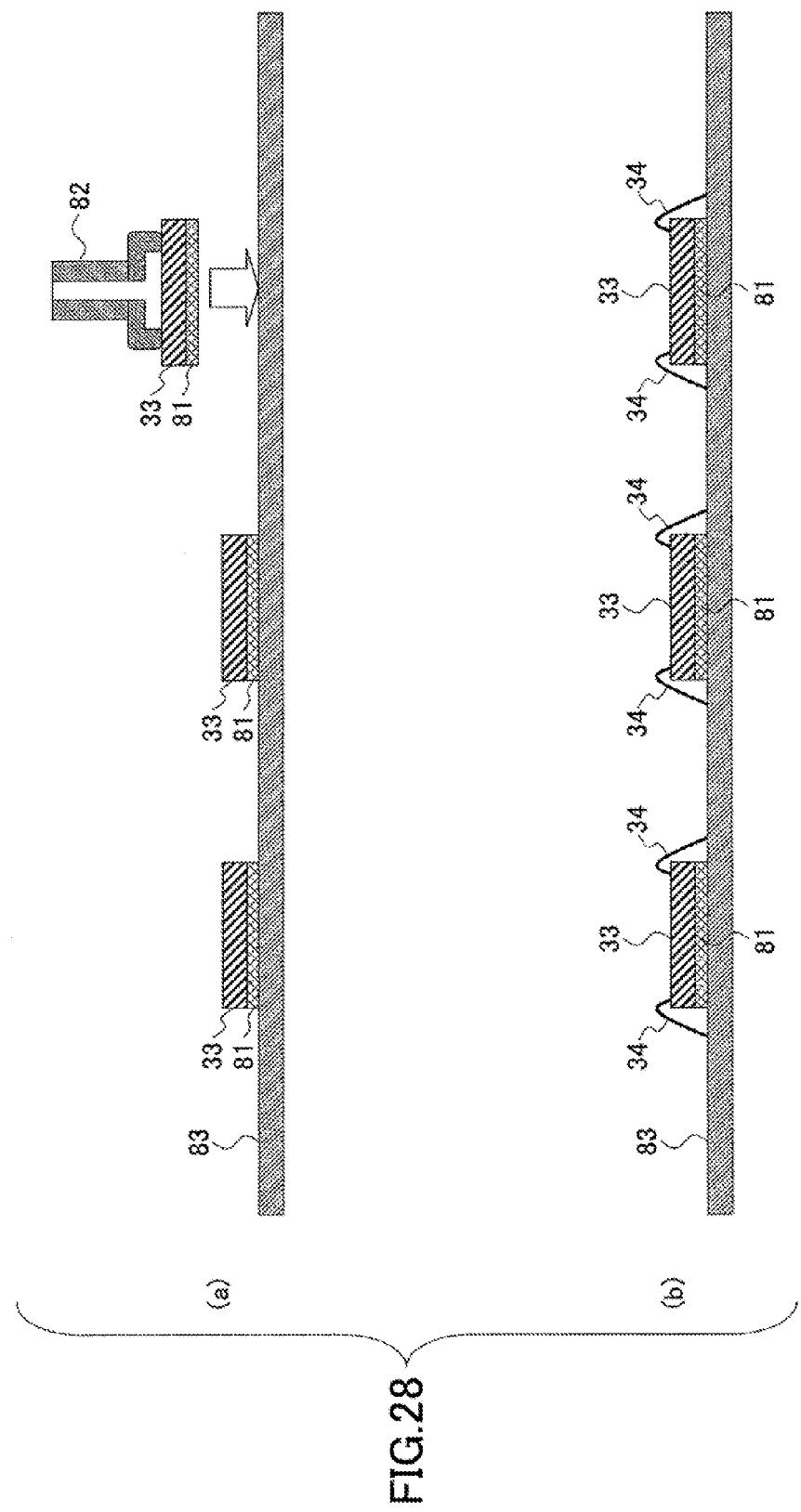
FIG. 28 is a first view for explaining a manufacturing method of the semiconductor device of the third embodiment.
Figure 29:
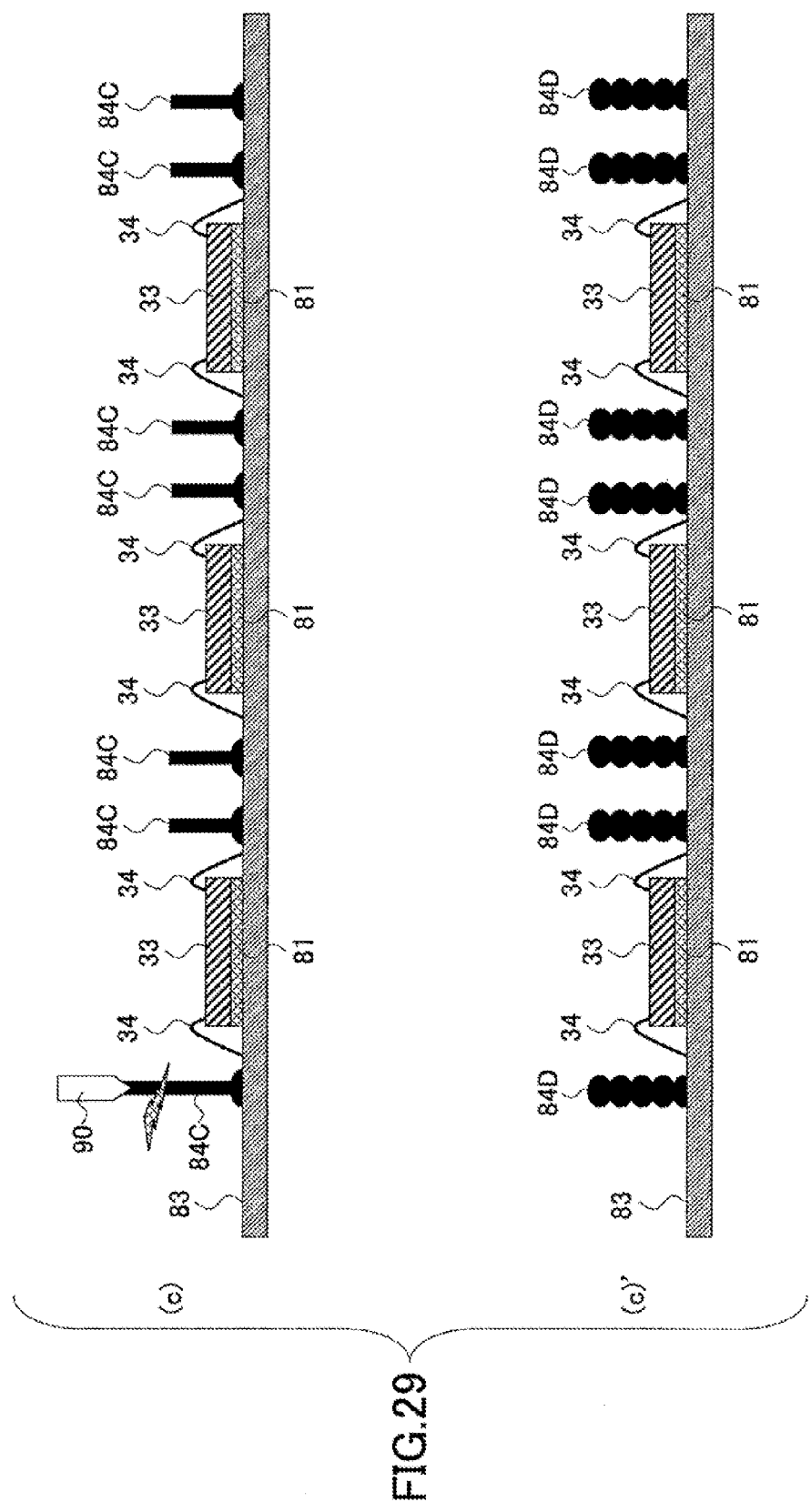
FIG. 29 is a second view for explaining the manufacturing method of the semiconductor device of the third embodiment.
Figure 30:
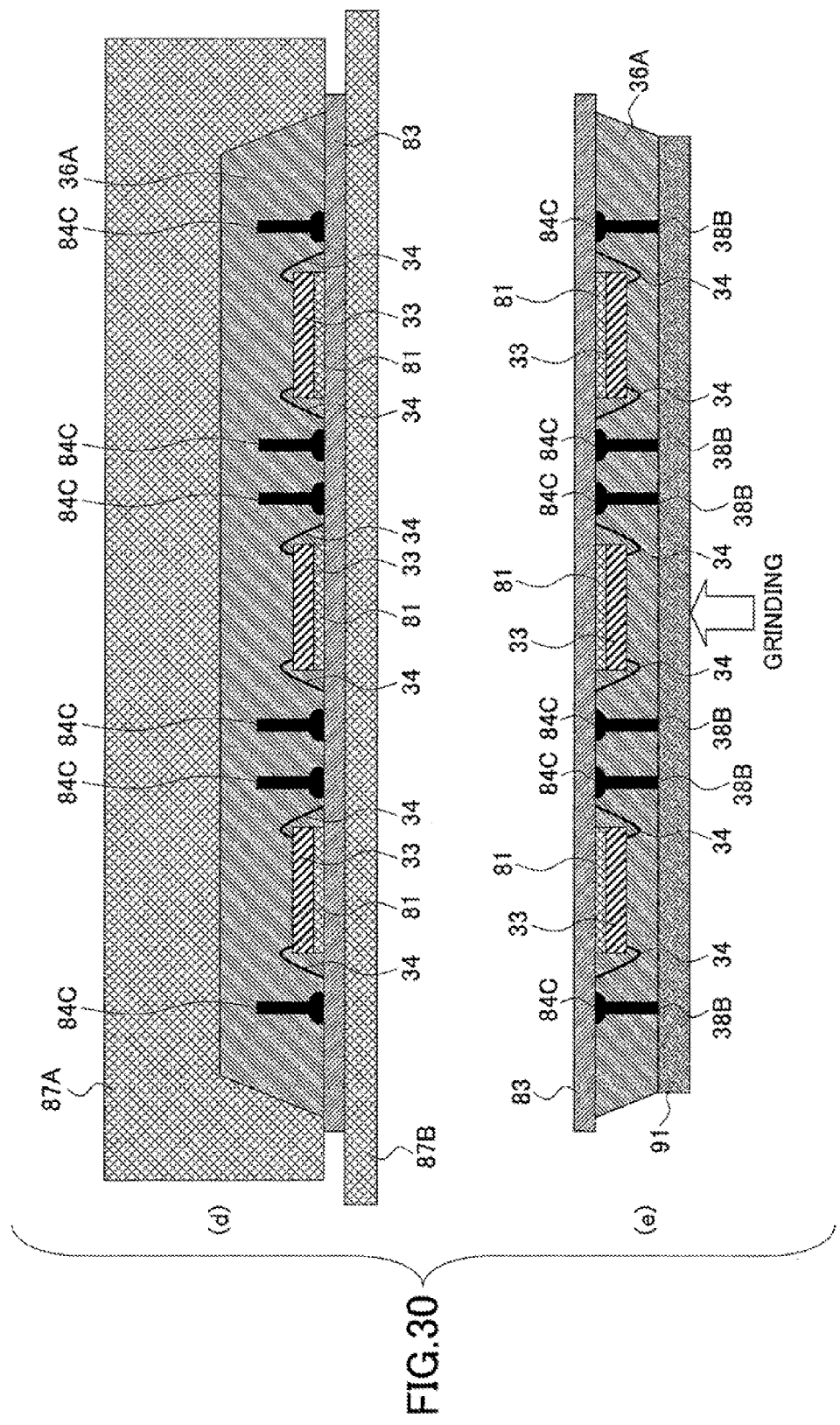
FIG. 30 is a third view for explaining the manufacturing method of the semiconductor device of the third embodiment.
Figure 31:
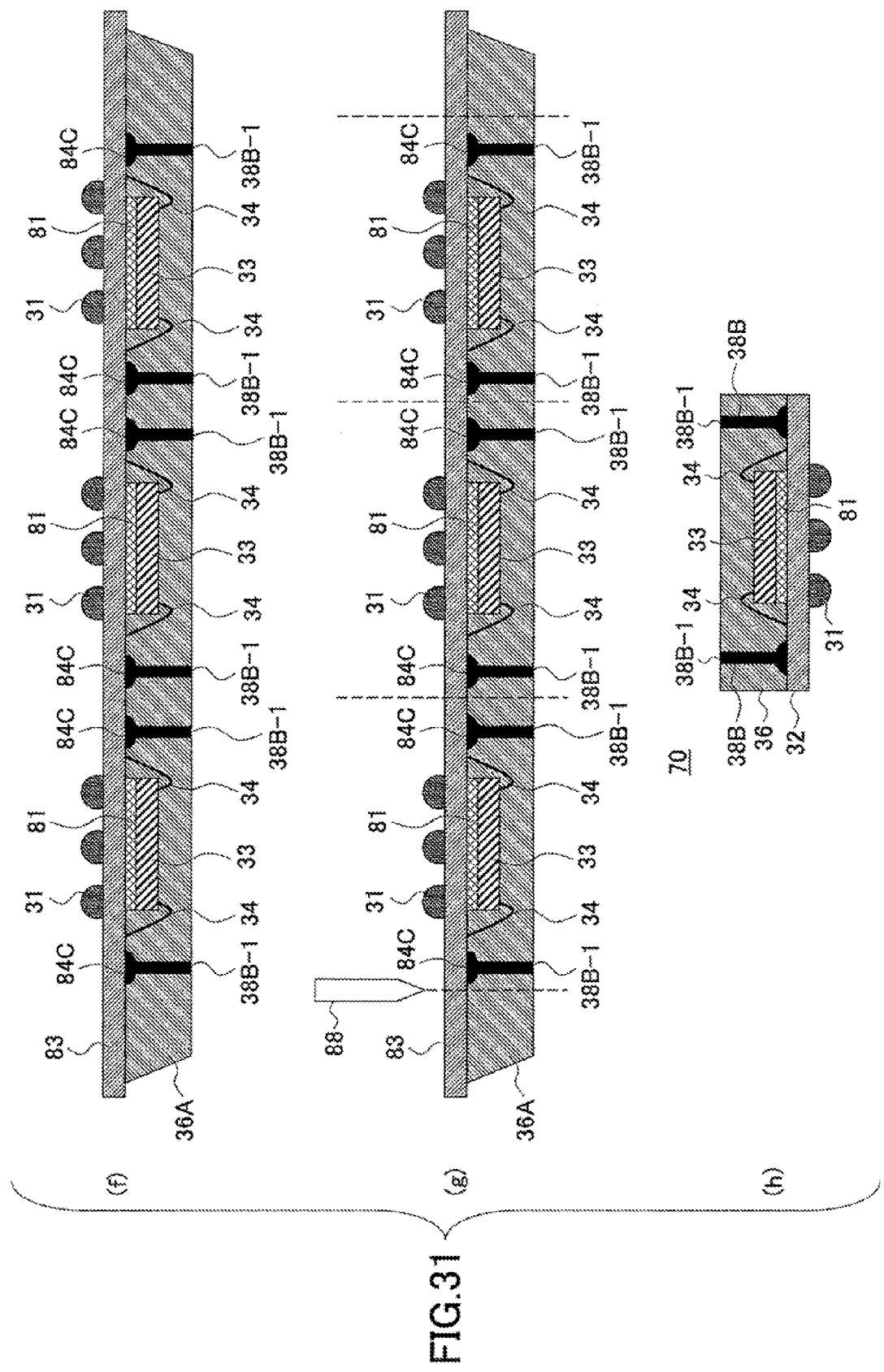
FIG. 31 is a fourth view for explaining the manufacturing method of the semiconductor device of the third embodiment.
Figure 32:
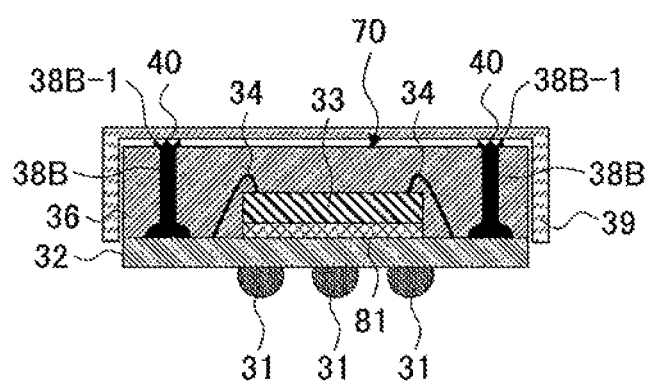
FIG. 32 is a fifth view for explaining the manufacturing method of the semiconductor device of the third embodiment.

In this example, as well as the structure illustrated in FIG. 22, the connection projection part 39B is provided at a part of the internal side surface of the shielding member 39, the part corresponding to the end surface 38-1 of the ground electrode 38 exposed at the side surface of the sealing resin 36. In addition, the length L between the connection projection parts 39B facing each other is substantially equal to or slightly shorter than the external dimension P of the semiconductor device 30.

At this time, by providing the adhesive (not illustrated) on the internal bottom surface of the shielding member 39, it is possible to fix the shielding member 39 to the sealing resin 36 by the adhesive.

Of course, the adhesive may be arranged on the upper surface of the sealing resin 36 in advance.

Thus, according to the manufacturing method of this example, it is possible to provide the ground electrode 38 with a relatively simple step.

In particular, in a case where the ground electrodes 38 are formed by the bonding wire method, it is possible to provide the ground electrodes 38 by the same step as the step of providing the bonding wires 34, and therefore it is possible to simplify the manufacturing process.

In addition, according to the manufacturing method of this example, the ground electrode 38 is exposed at the side surface of the sealing resin 36 along the length direction, namely in the shape of a loop or a rectangle without one side.

Therefore, it is possible to make the contact area with the shielding member 39 large. Because of this, there is no need to increase the number of the ground electrodes 38 exposed from the side surface of the sealing resin 36. Hence, it is possible to simplify the step of providing the ground electrodes 38. Accordingly, it is possible to manufacture the semiconductor device with a small number of steps and a short time. Of course, in a case where plural ground electrodes 38A are provided, it is possible to decrease the electrical resistance so that stable electrical connection can be maintained and it is possible to achieve a further heat radiation effect.

3. Third Example of the Manufacturing Method of the Semiconductor Device

A manufacturing method of the semiconductor device of the third embodiment is discussed with reference to FIG. 28 through FIG. 32.

In the drawings mentioned below, parts that are the same as the parts depicted in FIG. 14 through FIG. 27 are given the same reference numerals, and explanation thereof is omitted.

First, a main surface (a surface where an electronic circuit element and an electronic circuit are formed) of the semiconductor element 33 having a rear surface where the die bonding material 81 such as a die bonding film is adhered and held by an absorbing collet 82. The semiconductor element 33 adhered and held by the absorbing collet 82 is mounted on and fixed to, via the die bonding material 81, a large size board 83 which will become the wiring board 32. See FIG. 28(a). Plural semiconductor elements 33 are mounted on and fixed to the board 83.

Next, the electrode pads of the semiconductor elements 33 and the electrode pads of the board 83 (not illustrated) provided so as to correspond to the electrode pads of the semiconductor elements 33 are connected to each other by using the bonding wires 34. See FIG. 28(b). At this time, in an area situated outside the electrode pads to which the bonding wires 34 are connected on the upper surface of the board 83, namely in a position far from the semiconductor elements 33, the bonding wires 84C extending in the substantially vertical direction are provided on the electrode pads (not illustrated) connected to the ground wiring pattern 35 (not shown) by using the bonding tool 90. In a case where the bonding wire 84C extending in the vertical direction has the same diameter as that of the boding wire 34 and is formed by the same material as that of the bonding wire 34, the boding wires 84C can be formed in the same wire bonding step. In other words, wire bonding is performed by using a known bonding tool 90 on the electrode pads 37 (see, for example, FIG. 3) and the bonding tool 90 is pulled up in the vertical direction. In a position higher than the top part of the wire loop of the bonding wire 84C, the wire is cut.

The bonding wire 84C extending in the vertical direction will become the ground electrode 38 in a step below.

As the ground electrode 38, instead of the bonding wire 84C, a columnar pin made of metal and having a designated length (height) may be applied.

Alternatively, plural ball bumps 84D are stacked on the electrode pad 37 and the upper surface of the top ball bump 84D is positioned at the designated height, so that the ground electrode 38 is formed. See FIG. 29(c)'. In any case, the ground electrode 38 has length whereby the head end part is exposed at the upper surface of the sealing resin 36 of the semiconductor device 70.

Next, plural semiconductor elements 33 mounted on the board 83, the bonding wires 34 connected to the semiconductor elements 33, the bonding wires 84C, and others are sealed by the sealing resin 36A. See FIG. 30(d). At this time, plural semiconductor elements 33 mounted on and fixed to the main surface of the board 83, the bonding wires 34 connected to each semiconductor element 33, the bonding wires 84C, and others are sealed in a lump.

A compression molding method or a so-called transfer molding method using molds 87 (an upper mold 87A and a lower mold 87B) may be applied to this resin sealing process.

A grinding process is applied to the sealing resin 36A so that the ground electrodes 38B are exposed at the upper surface of the sealing resin 36A. See FIG. 30(e). The grinding process may be performed with a grinder 91.

After that, solder balls 31 as outside connection terminals, corresponding to plural semiconductor elements 33, are provided on another main surface (rear surface) of the board 83. See FIG. 31(f). Next, the board 83 and the sealing resin 36A are cut in their thickness directions. See FIG. 31(g). In this cutting process, the semiconductor element 33 sealed by the sealing resin 36A on the main surface of the board 83, the bonding wires 34 connected to the semiconductor element 33, and others are treated as a single unit. A blade dicing method using a dicing saw 88 may be used as a cutting method. A so called laser dicing method also may be used.

As a result of this, the semiconductor device 70 is formed where the semiconductor element 33, the bonding wires 34 connected to the semiconductor element 33, the ground electrodes 38B, and others are provided on the main surface of the wiring board 32 and sealed by the sealing resin 36. See FIG. 31(g). In the semiconductor device 70, the end part 38-1 of the ground electrode 38B is exposed at the side surface of the sealing resin 36. On the other hand, the solder balls 31 as the outside connection terminals are provided on another main surface of the wiring board 32. See FIG. 31(h). Next, the box-shaped metal shielding member 39 (having a cross section of a rectangle without one side) is provided so as to cover the sealing resin 36.

In other words, the adhesive 40 made of the conductive adhesive is provided on the end parts 38B-1 of the ground electrodes 38B exposed at the upper surface of the sealing resin 36.

After that, the box-shaped metal shielding member 39 (having a cross section of a rectangle without one side) is provided so as to cover the sealing resin 36 of the semiconductor device 70. See FIG. 32. Thus, the semiconductor device 70S having the shielding member 39 covering the sealing resin 36 is formed.

As a result of this, the internal surface of the shielding member 39 and the end parts 38B-1 of the ground electrodes 38B led to the upper surface of the sealing resin 36 are connected to each other via the adhesive member 40 made of the conductive adhesive such as solder or silver (Ag) paste so that electric conductance is made.

In other words, ground potential is applied to the shielding member 39 at the time of operation of the semiconductor device 70.

Under this structure, the ground electrodes 38B are connected to the shielding member 39 via the end parts 38B-1.

The internal side surface and/or the bottom surface of the shielding member 39 and the surface of the sealing resin 36 are fixed to each other via the adhesive (not illustrated).

According to such a manufacturing method, the ground electrodes 38 can be arranged with a simple step. In particular, in a case where the ground electrodes 38 are formed by the bonding wire method, it is possible to provide the ground electrodes 31 by the same step as the step of providing the bonding wires 34, and therefore it is possible to simplify the manufacturing process.

As discussed above, in the semiconductor device 30 of the first embodiment and the semiconductor device 70 of the third embodiment, depending on the circuit structure or function on the semiconductor element 33, it is possible to arrange the ground electrode pads 37 on the same line as the electrode pad line where the bonding wires 34 are connected.

Accordingly, in the first and third examples of the manufacturing method of the semiconductor device, corresponding to such a structure, the electrode pads, the bonding wires, and the ground electrodes may be provided.

The present invention is not limited to these embodiments, but variations and modifications may be made without departing from the scope of the present invention.

For example, the embodiments may be applied to LGA (Land Grid Array) type semiconductor devices.

According to the embodiments, it is possible to provide a semiconductor device and a manufacturing method of the same, whereby the semiconductor device can be securely shielded from an electromagnetic wave with a simple structure and without causing a large size of a wiring circuit board.

The embodiments can be applied to a semiconductor device and a manufacturing method of the same, and more specifically, to a semiconductor device which can have a shielding structure, a semiconductor device having a shielding structure, and a manufacturing method of the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority or inferiority of the invention. Although the embodiments of the present invention have been described in detail, it should be understood that various changes, substitutions, and alterations could be made hereto without departing from the spirit and scope of the invention.

What is claimed is:

1. A manufacturing method of a semiconductor device comprising:
   mounting plural semiconductor elements on a wiring board having a wiring layer on an upper surface;
   providing a ground electrode member so that the ground electrode member strikes an area of the wiring board where neighboring of the semiconductor elements are provided;
   covering the semiconductor elements and the ground electrode member with sealing resin;

cutting the wiring board, the sealing resin and the ground electrode member so that a piece of the semiconductor device including a ground electrode, which is covered with the sealing resin, having an end connected to the wiring layer on the upper surface of the wiring board at a portion covered with the sealing resin, and having another end as an exposed part which is exposed at a side surface of the sealing resin is formed; and providing a shielding member to cover the sealing resin of the piece of the semiconductor device and be connected to the exposed part of the ground electrode, wherein solder or a conductive adhesive is provided at the exposed part of the ground electrode exposed at the side surface of the resin, the shielding member is made come in contact with the exposed part of the around electrode via the conductive adhesive, and the shielding member is heated so that the metal member and the exposed part of the ground electrode are connected to each other.

2. The manufacturing method of a semiconductor device as claimed in claim 1, wherein a projection part is formed as a portion of the shielding member and the exposed part of the ground electrode is connected to the projection part of the shielding member.

3. A manufacturing method of a semiconductor device comprising:

providing a ground electrode member on a separation line of a wiring board where plural semiconductor elements are provided, the separation line separating neighboring semiconductor elements, the wiring board having a wiring layer on an upper surface;

sealing the ground electrode member and the semiconductor elements by resin;

cutting the ground electrode member along the separation line when the wiring board where the plural semiconductor elements are provided is cut, so that a ground electrode, which is covered with the resin, has an end connected to the wiring layer on the upper surface of the wiring board at a portion covered with the resin, and has another end as an exposed part which is exposed at a side surface of the resin; and providing a metal member configured to cover the resin so as to make the metal member come in contact with the exposed part of the ground electrode exposed at the side surface of the resin, wherein solder or a conductive adhesive is provided at the exposed part of the ground electrode exposed at the side surface of the resin, the metal member is made come in contact with the exposed part of the ground electrode via the conductive adhesive, and the metal member is heated so that the metal member and the exposed part of the ground electrode are connected to each other.

4. The manufacturing method of a semiconductor device as claimed in claim 3, wherein the metal member is a plate-shaped member; and the metal member is made to come in contact with the exposed part of the ground electrode via the conductive adhesive by bending the metal member.

5. The manufacturing method of a semiconductor device as claimed in claim 3, wherein a projection part is formed as a portion of the metal member; and the exposed part of the ground electrode is connected to the projection part of the metal member.

* * * * *